(12) United States Patent
Morimoto

(10) Patent No.: US 12,044,802 B2
(45) Date of Patent: Jul. 23, 2024

(54) PHOTOELECTRIC CONVERSION DEVICE AND PHOTOELECTRIC CONVERSION SYSTEM COMPRISING A CONTROL UNIT TO SET A THIRD EXPOSURE PERIOD AND A.FOURTH EXPOSURE PERIOD ON A BASIS OF LIGHT VALUE COMPARISON BASED ON SIGNAL CHARGE DURING FIRST AND SECOND EXPOSURE PERIODS

(71) Applicant: CANON KABUSHIKI KAISHA, Tokyo (JP)

(72) Inventor: Kazuhiro Morimoto, Kanagawa (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 18/303,480

(22) Filed: Apr. 19, 2023

(65) Prior Publication Data

US 2023/0258776 A1 Aug. 17, 2023

Related U.S. Application Data

(63) Continuation of application No. PCT/JP2021/038032, filed on Oct. 14, 2021.

(30) Foreign Application Priority Data

Oct. 21, 2020 (JP) .................... 2020-176599

(51) Int. Cl.
    *G01S 7/48* (2006.01)
    *G01S 7/481* (2006.01)
    (Continued)

(52) U.S. Cl.
    CPC .......... *G01S 7/4816* (2013.01); *G01S 7/4865* (2013.01); *G01S 17/10* (2013.01); *H04N 25/53* (2023.01); *H04N 25/771* (2023.01); *H04N 25/79* (2023.01)

(58) Field of Classification Search
    CPC .......... G01S 17/88; G01S 17/89; G01S 17/00; G01S 17/02; G01S 17/04; G01S 17/06;
    (Continued)

(56) References Cited

U.S. PATENT DOCUMENTS 10,598,936 B1 * 3/2020 Berkovich .............. G06F 3/011
11,284,023 B2 * 3/2022 Yamanaka ........... H04N 25/615
(Continued)

FOREIGN PATENT DOCUMENTS

CN      108369275 A    8/2018
CN      111971578 A    11/2020
(Continued)

*Primary Examiner* — Seung C Sohn
(74) *Attorney, Agent, or Firm* — CANON U.S.A., INC. IP Division

(57) ABSTRACT

A photoelectric conversion device includes a photoelectric conversion unit, a light value holding unit that holds light values based on signal charges generated during a first exposure period and a second exposure period having at least one of start timing and end timing different from that of the first exposure period, a comparison unit that compares the light value based on the signal charge generated during the first exposure period with the light value based on the signal charge generated during the second exposure period, and a control unit that sets a third exposure period and a fourth exposure period having at least one of the start timing and end timing different from that of the third exposure period on the basis of a comparison result of the comparison unit. The third and fourth exposure periods are less than at least one of the first and second exposure periods.

20 Claims, 15 Drawing Sheets

(51) Int. Cl.
  *G01S 7/4865* (2020.01)
  *G01S 17/10* (2020.01)
  *H04N 25/53* (2023.01)
  *H04N 25/771* (2023.01)
  *H04N 25/79* (2023.01)

(58) Field of Classification Search
  CPC ........... G01S 17/42; G01S 7/48; H04N 25/53;
       H04N 25/77; H04N 25/78; H04N 25/79;
       H04N 23/70; H04N 23/71; H04N 23/74;
       H04N 23/75; H01L 31/107; H01L 31/02;
                                H01L 27/146
  USPC .................................. 250/214 R, 208.1, 221
  See application file for complete search history.

(56) References Cited

U.S. PATENT DOCUMENTS

| | | |
|---|---|---|
| 2017/0052065 A1 | 2/2017 | Sharma |
| 2018/0104734 A1 | 4/2018 | Gaebges et al. |
| 2018/0259647 A1 | 9/2018 | Takano |
| 2019/0007592 A1* | 1/2019 | Otani ..................... G01S 17/89 |
| 2021/0011130 A1 | 1/2021 | Nagata |

FOREIGN PATENT DOCUMENTS

| | | |
|---|---|---|
| EP | 3879291 A1 | 9/2021 |
| WO | 2017/005503 A1 | 1/2017 |
| WO | 2017085916 A1 | 5/2017 |
| WO | 2019188348 A1 | 10/2019 |
| WO | 2020027221 A1 | 2/2020 |

* cited by examiner

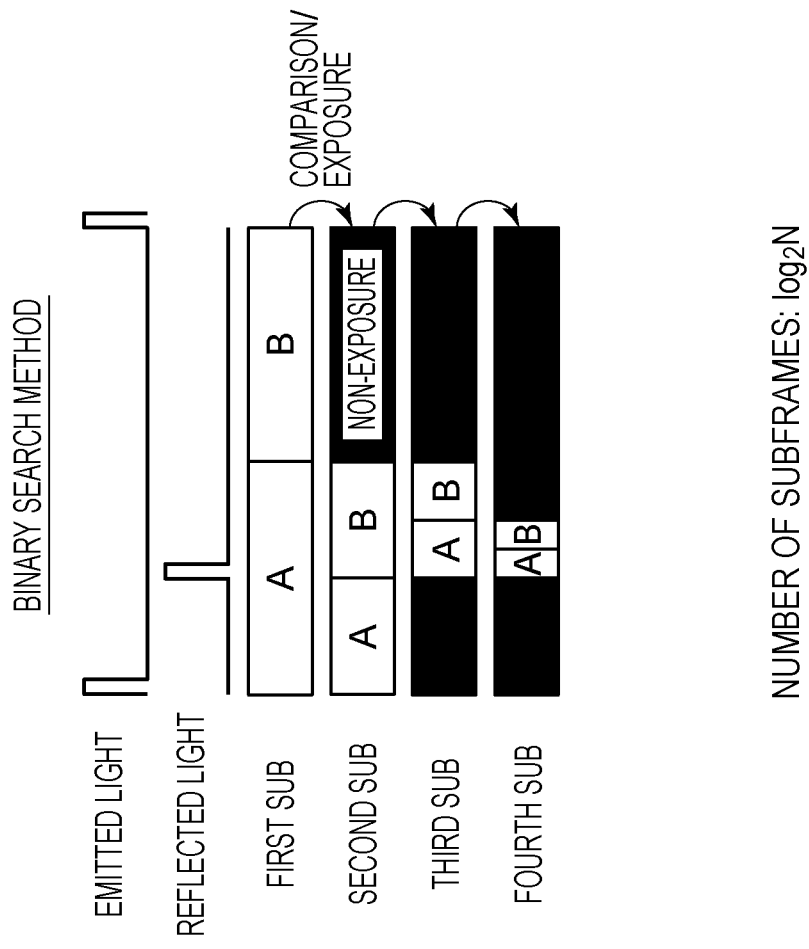
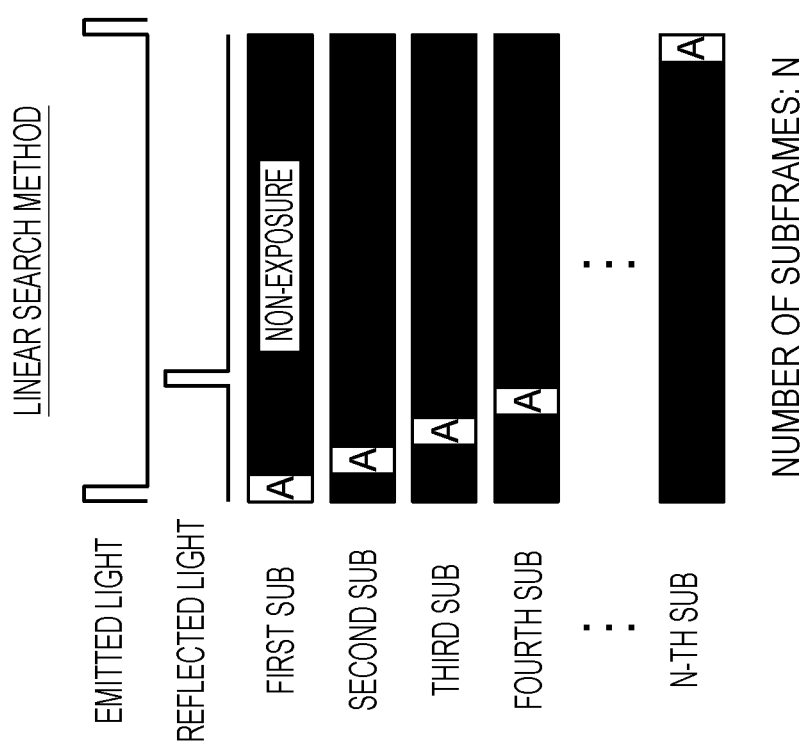

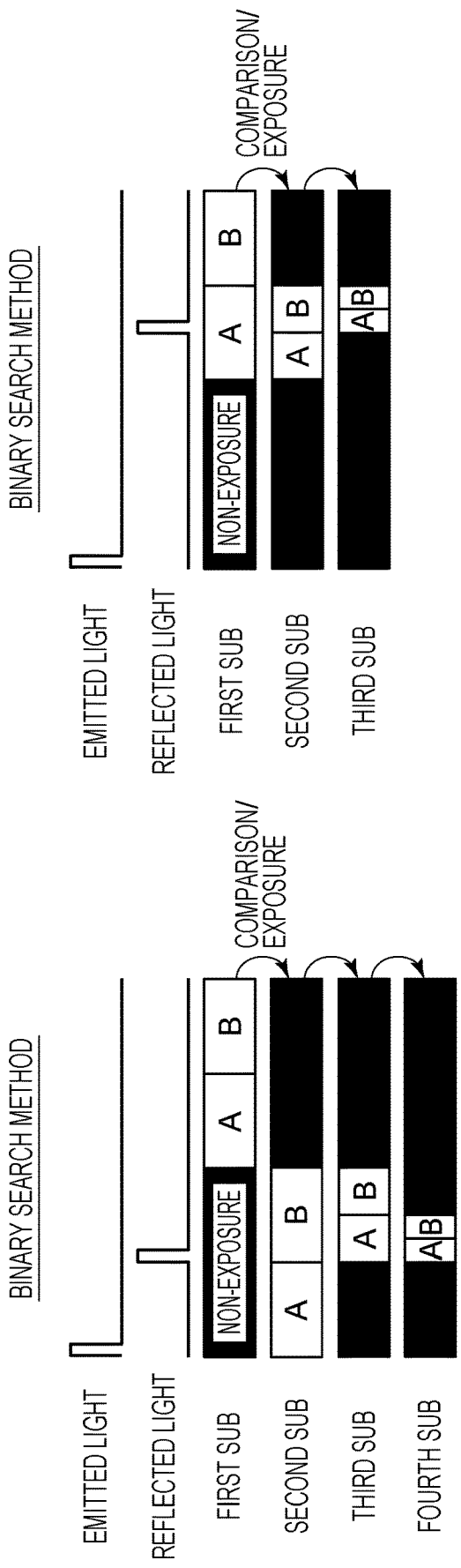

FIG. 15
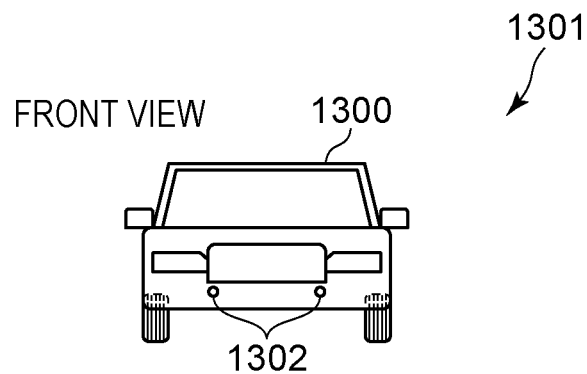
FRONT VIEW 1300 1301
1302
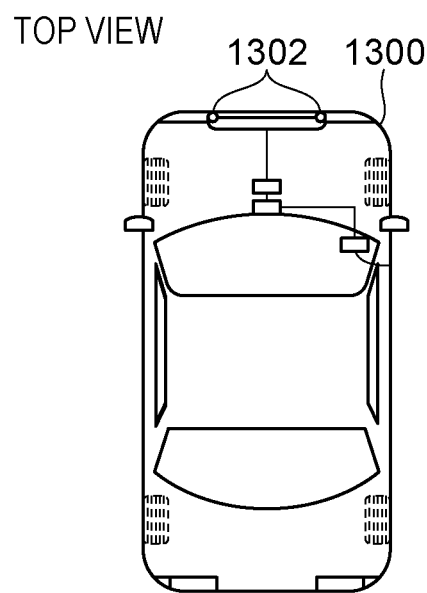
TOP VIEW 1302 1300
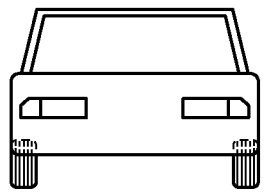
REAR VIEW

PHOTOELECTRIC CONVERSION DEVICE AND PHOTOELECTRIC CONVERSION SYSTEM COMPRISING A CONTROL UNIT TO SET A THIRD EXPOSURE PERIOD AND A FOURTH EXPOSURE PERIOD ON A BASIS OF LIGHT VALUE COMPARISON BASED ON SIGNAL CHARGE DURING FIRST AND SECOND EXPOSURE PERIODS

CROSS-REFERENCE TO RELATED APPLICATIONS

This application is a Continuation of International Patent Application No. PCT/JP2021/038032, filed Oct. 14, 2021, which claims the benefit of Japanese Patent Application No. 2020-176599, filed Oct. 21, 2020, both of which are hereby incorporated by reference herein in their entirety.

TECHNICAL FIELD

The present invention relates to a photoelectric conversion device and a photoelectric conversion system.

BACKGROUND ART

A TOF (Time Of Flight) technique is often used to measure the distance to an object to be measured. According to the TOF technique, light is emitted from a light source, and reflected light reflected by the object to be measured is detected. Thereafter, in the TOF technique, the distance to the object to be measured is measured by measuring the time difference between the timing when the light is emitted and the timing when the reflected light is detected.

PTL 1 describes a TOF rangefinder using an SPAD (Single Photon Avalanche Diode) in which photocharge caused by a single photon causes avalanche multiplication in a PN junction region of a semiconductor region that constitutes a photoelectric conversion unit. In addition, PTL 1 describes distance measurement based on a time-gated method in which the mode of detecting a photon signal incident on a SPAD (an exposure mode) and the mode of not detecting a photon signal (a non-exposure mode) are switched at high speed by a pulse signal having a width on the order of picoseconds to microseconds.

CITATION LIST

Patent Literature

PTL 1 U.S. Patent Application Publication No. 2017/0052065

However, according to PTL 1, to accurately measure the time distribution of detected light, it is necessary to scan the relative difference of the time gate timing with respect to the light emission timing at fine intervals within the time range corresponding to a predetermined distance measurement range. For this reason, the time required for one distance measurement increases, making it difficult to speed up measurement of the distance from the photoelectric conversion device to an object to be measured.

SUMMARY OF INVENTION

According to one embodiment, a photoelectric conversion device includes a photoelectric conversion unit, a light value holding unit configured to hold light values based on signal charges generated during a first exposure period and a second exposure period having at least one of start timing and end timing different from that of the first exposure period, a comparison unit configured to compare the light value based on the signal charge generated during the first exposure period with the light value based on the signal charge generated during the second exposure period, and a control unit configured to set a third exposure period and a fourth exposure period having at least one of the start timing and end timing different from that of the third exposure period on a basis of a comparison result of the comparison unit, wherein the third exposure period and the fourth exposure period are less than at least one of the first exposure period and the second exposure period.

According to one embodiment, a photoelectric conversion device includes a photoelectric conversion unit, a light value holding unit configured to hold light values based on signal charges obtained when light is incident during a first exposure period and a second exposure period having at least one of start timing and end timing different from that of the first exposure period, a comparison unit configured to compare the light value obtained during the first exposure period with the light value obtained during the second exposure period, and a control unit configured to control a third exposure period and a fourth exposure period in accordance with a comparison result of the comparison unit.

Further features of the present invention will become apparent from the following description of exemplary embodiments with reference to the attached drawings.

BRIEF DESCRIPTION OF DRAWINGS

FIGS. 2A and 2B are timing diagrams illustrating exposure patterns according to a comparative embodiment and Embodiment 1.

FIGS. 11A and 11B are timing diagrams illustrating an exposure pattern according to Embodiment 5.

FIG. 15 is a block diagram of a photoelectric conversion system according to Embodiment 9.

DESCRIPTION OF EMBODIMENTS

Figure 1:
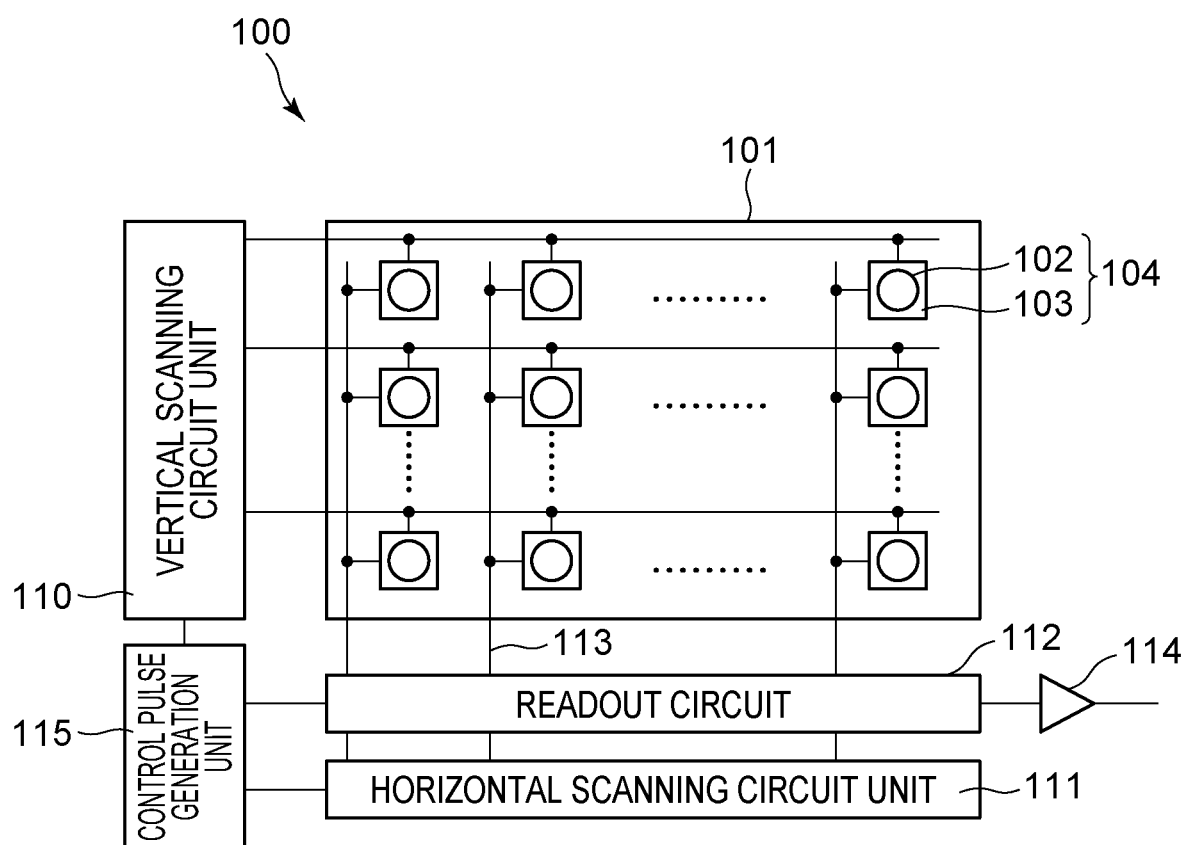
FIG. 1 is a schematic illustration of an example of a photoelectric conversion device according to Embodiment 1.

The embodiments described below are for embodying the technical concept of the present invention and are not intended to limit the present invention. The sizes and positional relationships of members illustrated in the drawings may be exaggerated for clarity of description. In the following description, the same configuration may be identified by the same reference numeral, and description of the configuration may be omitted.

Embodiment 1

Embodiment 1 is described with reference to FIGS. 1 to 4. FIG. 1 is a block diagram of a photoelectric conversion device 100 of the present embodiment. The photoelectric conversion device 100 includes a pixel unit 101, a control pulse generation unit 115, a horizontal scanning circuit unit 111, a readout circuit 112, a signal line 113, and a vertical scanning circuit unit 110. In the pixel unit 101, a plurality of pixels 104 are arranged in a two-dimensional array (matrix). Each of the pixels 104 is composed of a photoelectric conversion unit 102 including an avalanche photodiode (hereinafter referred to as "APD") and a pixel circuit 103. Note that at least APDs are required to be arranged in a two-dimensional array in the pixel unit 101. The photoelectric conversion unit 102 converts light into an electrical signal. The pixel circuit 103 outputs the electrical signal converted by the photoelectric conversion unit 102 to the signal line 113.

The vertical scanning circuit unit 110 receives a control pulse supplied from the control pulse generation unit 115 and supplies the control pulse to each of the pixels. Logic circuits, such as a shift register and an address decoder, are used in the vertical scanning circuit unit 110.

A signal output from the photoelectric conversion unit 102 of each of the pixels is processed by the pixel circuit 103. The pixel circuit 103 includes a counter circuit and/or a memory. Hereinafter, the pixel circuit 103 including a memory is described. The memory holds a digital value.

The horizontal scanning circuit unit 111 inputs a control pulse for sequentially selecting each of columns to the pixel circuit 103 to read a signal from the memory of the pixel holding a digital signal.

The signal from the pixel circuit 103 of the pixel 104 selected by the vertical scanning circuit unit 110 is output to the signal line 113 for the selected row.

The signal output to the signal line 113 is output to an external recording unit or a signal processing unit of the photoelectric conversion device 100 via the output circuit 114.

In FIG. 1, the pixel unit 101 includes the pixels 104 arranged in a two-dimensional array. The pixel unit 101 may include the plurality of pixels 104 arranged one-dimensionally. Alternatively, the pixel unit 101 may include only a single pixel instead of an array.

The function of the pixel circuit 103 does not necessarily have to be provided for each of the pixels 104. For example, one pixel circuit 103 may be shared by the plurality of pixels 104, and the signal processing may be performed sequentially. The photoelectric conversion device may use a layered sensor in which a first substrate having a photoelectric conversion unit and a second substrate having a pixel circuit are stacked and joined to achieve high sensitivity and high functionality. In this case, the photoelectric conversion unit and the pixel circuit are electrically connected via connection wiring provided for each of the pixels.

The principle of increasing the speed of distance measurement, which is the effect of the present invention, is described below with reference to FIGS. 2A and 2B.

FIG. 2A is a diagram of a comparative embodiment and illustrates a linear search method for finding the timing of reflected light among the time-gated TOF techniques. FIG. 2B illustrates a binary search method for searching the timing of reflected light according to the present embodiment. In FIG. 2A, a range illustrated in white in each of subframes denotes an exposure period of the pixel 104, and the range illustrated in black denotes a non-exposure period.

According to the present embodiment, the term "exposure period" refers to, for example, a period during which the photoelectric conversion unit 102 is active and a signal from the photoelectric conversion unit 102 can be read out by a counter circuit and/or a register circuit. The term "non-exposure period" refers to a period during which no signal is read out from the photoelectric conversion unit 102 by the counter circuit and/or the register circuit. In the following description, the exposure period is defined as a period during which a reverse bias potential capable of causing avalanche multiplication is applied to an APD, a gate element is turned on, and a signal from the APD can be read out by the counter circuit and/or the register circuit. In addition, the non-exposure period is defined as a period during which a signal from the APD is not read out via the gate element. The non-exposure period is not limited thereto.

For example, the non-exposure period may be defined as a period during which the potential difference applied to the APD is reduced so that avalanche multiplication does not occur in the APD, and the exposure period may be defined as a period during which a potential difference that causes avalanche multiplication in APD is applied. Alternatively, the non-exposure period may be defined as a period during which the counter circuit and/or the register circuit are controlled not to be driven, and the exposure period may be defined as a period during which the counter circuit and/or the register circuit are controlled to be driven.

In FIGS. 2A and 2B, the subframes are arranged from the emitted light for ease of understanding. In reality, driving is performed so that the light amount is measured for a first subframe at the time of the first emitted light. Thereafter, the second emitted light is emitted at the same timing as the first emitted light, and the light amount is measured for the second subframe at the time of the second emitted light. Thereafter, the light amount is measured for the N-th subframe at the time of the N-th emitted light.

In the comparative embodiment, the light amount is measured N times while shifting the start timing and the end timing of the exposure period relative to the light emission timing of the light source. That is, the reflected light is measured while shifting the start timing of the exposure period little by little. When the timing of the exposure period is linearly scanned in steps over a predetermined distance measurement range, the time resolution or distance measurement accuracy of detection of the reflected light increases in proportion to the number of steps N of linear scan. However, when the number of steps is increased and, thus, the number of subframes is increased, it takes a long time to measure the distance.

In contrast, according to the present embodiment, for the first subframe, the period corresponding to the cycle of emitted light is time-divided into two or more exposure periods. For example, the period is time-divided into exposure periods A and B, the light intensity in each of the exposure periods is measured independently, and the light intensities in the exposure periods A and B are compared. In the illustration diagram, since the reflected light is included in the exposure period A, the light signal amount in the exposure period A is greater than the light signal amount in the exposure period B. Assuming that the reflected light is included in the exposure period A on the basis of the comparison result, the exposure period A is further divided into two within the length of the exposure period A of the first subframe, and two exposure periods A and B for the second subframe are determined. In this way, by comparing the light amounts in two or more exposure periods in each of the subframes and successively repeating determination of the exposure pattern in the subsequent subframe, in particular, repeating determination of the timing and period of exposure, the accuracy of the estimation of the timing of the reflected light is improved. As a result, the linear search requires N light amount measurements, while the binary search can reduce the number of light amount measurements to Log 2(N). This can speed up the distance measurement.

Although in FIG. 2A, only one light emission and only one exposure period are illustrated for each of the subframes, light signals obtained by repeating each of the subframes a plurality of times may be summed. Thus, the accuracy of light signal measurement can be improved. In this case, according to the comparative embodiment, the time resolution or distance measurement accuracy of reflected light detection increases in proportion to the number of steps N of linear scan.

Therefore, the effect of increasing the speed of distance measurement by applying the present embodiment is prominent.

Note that FIG. 2B illustrates an example of dividing the exposure period into two equal parts as a binary search method. Description of the drawings below is given on the basis of the method of dividing the exposure period into two equal parts. However, the term "binary search method" is not limited to dividing the exposure period into two equal parts. Even if the exposure period is divided into three or more equal parts to make a search, the method is also referred to as a binary search method. That is, the binary search method is the name of a method different from the linear scan method and is not limited to dividing the exposure period into two equal parts. In addition, the lengths of the two exposure periods A and B in one subframe may be different. Furthermore, in the step of comparison, instead of comparison of the signal amounts in the exposure periods A and B, signals A' and B' obtained by performing predetermined arithmetic processing or correction processing on the respective signals may be compared.

Figure 3:
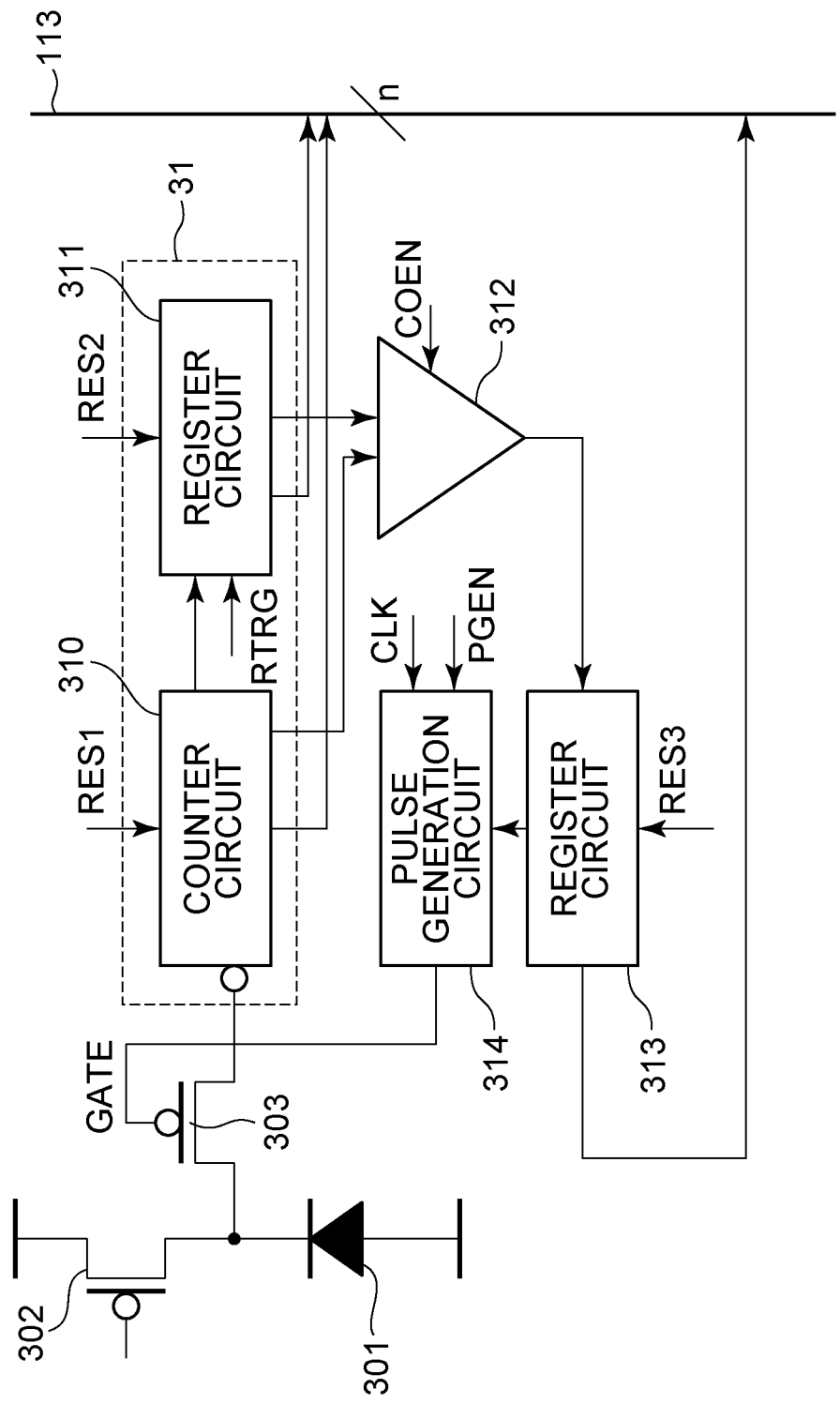
FIG. 3 is a block diagram of a unit pixel according to Embodiment 1.

FIG. 3 is an example of a block diagram of a unit pixel according to the present embodiment. As described above, the pixel has the photoelectric conversion unit and the pixel circuit. In FIG. 3, an APD 301 is used as the photoelectric conversion unit. The pixel circuit includes a quench element 302, a gate element 303 (a switch), a light value holding unit 31, a comparator circuit (a comparison unit) 312, a register circuit 313, and a pulse generation circuit 314. The light value holding unit 31 includes a counter circuit 310 and a register circuit 311.

The APD 301 is connected to the quench element 302 that controls the avalanche current. A photon detection signal output from the APD 301 is temporally controlled by a gate signal GATE input to the gate element 303. The output of the gate element 303 is input to the light value holding unit 31 including the counter circuit 310 and the register circuit 311. The photon detection signal that has passed through the gate element 303 is counted by the counter circuit 310, and the count value is written to the register circuit 311 in accordance with a trigger signal RTRG. That is, the register circuit 311 functions as a recording circuit. Upon receiving an enable signal COEN, the comparator circuit 312 compares the output values of the counter circuit 310 and the register circuit 311 and records the comparison result in the register circuit 313. Upon receiving a held signal of the register circuit 313, a clock signal CLK, and an enable signal PGEN, the pulse generation circuit 314 generates the gate signal GATE that defines an exposure pattern. Reset signals RES1, RES2, and RES3 initialize the held signals held in the counter circuit 310, the register circuit 311, and the register circuit 313, respectively.

The APD 301 generates charge pairs in accordance with incident light through photoelectric conversion. The cathode of the APD 301 is supplied with a potential based on a potential VH that is higher than a potential VL supplied to the anode. At this time, the anode and cathode of the APD 301 are provided with potentials so that a reverse bias is applied such that photons incident on the APD 301 are avalanche-multiplied. By performing photoelectric conversion while such a reverse bias potential is being supplied, avalanche multiplication of charges generated by incident light occurs, and an avalanche current is generated.

In the case where a reverse bias potential is supplied, if the potential difference between the anode and cathode is greater than the breakdown voltage, the APD operates in Geiger mode. Hereinafter, an APD that uses a Geiger mode operation to detect a weak signal at a single photon level at high speed is also referred to as a SPAD (Single Photon Avalanche Diode). According to the present embodiment, it is desirable to use a SPAD for high-speed detection of a weak signal. However, the APD may operate in a linear mode in which the charge is multiplied at a voltage below the breakdown voltage.

The quench element 302 need not be a quench element composed of a single transistor and may be a quench element composed of a plurality of transistors or a resistive element. When a photocurrent is multiplied by avalanche multiplication in the APD 301, the current obtained by the multiplied charge flows through a connection node between the APD 301 and the quench element 302. The voltage drop caused by the current decreases the potential of the cathode of the APD 301, and the APD 301 no longer forms the electronic avalanche. For this reason, the avalanche multiplication of the APD 301 stops. Thereafter, the potential VH of a power supply is supplied to the cathode of the APD 301 through the quench element 302, so that the potential supplied to the cathode of the APD 301 returns to the potential VH. That is, the operation region of the APD 301 becomes the Geiger mode operation again. In this way, the quench element 302 functions as a load circuit (a quench element) and has a function of suppressing avalanche multiplication during charge multiplication caused by avalanche multiplication (a quench operation). In addition, the quench element has the function of setting the operation region of the APD in the Geiger mode again after suppressing the avalanche multiplication (a recharge operation).

As the gate element 303, a switch circuit or a logic circuit using a plurality of transistors can be used instead of a single transistor. In FIG. 3, the pixel exposure period is adjusted by controlling the on/off operation of the gate element 303. The term "exposure period" refers to a period during which the APD 301 can detect a photon and the potential of the APD 301 is input to the light value holding unit 31. In addition, the term "non-exposure period" of a pixel refers to a period during which the potential of the APD 301 is not input to the light value holding unit 31. More specifically, the period during which the gate element 303 is turned on is the exposure period, and the period during which the gate element 303 is turned off is the non-exposure period. In FIG.

3, the gate element 303 is composed of a PMOS transistor. Therefore, when the signal input to the gate transitions from the first level (the high level) to the second level (the low level), the gate element 303 is switched on. When the signal transitions from the second level to the first level, the gate element 303 is turned off.

In the case where the gate element 303 is an NMOS transistor, the opposite is true. That is, when the signal input to the gate transitions from the second level to the first level, the gate element 303 is turned on, and when the signal transitions from the first level to the second level, the gate element 303 is turned off. The ON state of the gate element is the state in which the APD 301 and the light value holding unit 31 are electrically connected, and the OFF state of the gate element is the state in which the APD 301 and the light value holding unit 31 are not electrically connected. The gate element 303 may be replaced by an operation of temporally switching between an enabled state and disabled state of the operation performed by the counter without providing a specific element between the APD 301 and the counter circuit 310. In this case, the state in which the operation performed by the counter is enabled is the exposure period, and the state in which the operation performed by the counter is disabled is the non-exposure period.

The counter circuit 310 may use either a digital counter or an analog counter. The counter circuit 310 is connected to the register circuit 311 and the comparator circuit 312 so that an output signal output from the counter is input to the register circuit 311 and the comparator circuit 312. The register circuit 311 can hold a signal output from the counter circuit 310. The register circuit 311 is connected to the comparator circuit 312 so that the output of the register circuit 311 is input to the comparator circuit 312.

Some of the light value holding unit 31, the comparator circuit 312, the register circuit 313, and the pulse generation circuit 314 may be shared by a plurality of pixels.

The comparator circuit 312 is connected so as to compare the signal value output from the counter circuit 310 with the signal value output from the register circuit 311 and input the comparison result to the register circuit 313. The register circuit 313 is connected to the pulse generation circuit 314. The pulse generation circuit 314 is connected to the gate element, and the on/off state of the gate element is controlled on the basis of the output signal output from the pulse generation circuit 314. According to the present embodiment, the exposure period is set by controlling the on/off state of the gate element. That is, the pulse generation circuit 314 functions as a control unit that controls the exposure period.

The register circuit 313 is connected so as to output a signal to the signal line 113. Distance measurement can be performed on the basis of the value of the signal output from the register circuit 313. Therefore, the number of signal lines 113 is determined such that at least signals equal in number to the output bits of the register circuit 313 can be output.

Note that in FIG. 3, in addition to the register circuit 313, the counter circuit 310 and the register circuit 311 are connected to the signal line 113. By outputting the outputs from the counter circuit 310 and the register circuit 311 to the outside of the pixel via the signal line 113 in this manner, the reliability of the distance measurement result can be improved. For example, the signal values output from the register circuit 311 and the signal value output from the counter circuit 310 are output on a frame-by-frame basis. Then, the output signal values are compared with each other. There is a large difference between the signal value output from the register circuit 311 and the signal value output from the counter circuit 310 for the pixel on which the reflected light is incident. In contrast, for a pixel on which no reflected light is incident, only signals based on noise or ambient light are detected and, thus, there is little difference between the signal value output from the register circuit 311 and the signal value output from the counter circuit 310. By using the absolute values of such signal values and the difference between the signal values, it is possible to obtain information as to whether the pixel receives the reflected light and data regarding the detected noise and ambient light. Since these pieces of information can be used as information for determining the accuracy of distance measurement, the reliability of the distance measurement result can be improved.

When the output value of each of the register circuit 313, the counter circuit 310, and the register circuit 311 is output to the signal line 113, the number of signal lines may be set such that the signals from all the circuits can be output. Alternatively, the signal line 113 may be shared by the circuits. When the signal line 113 is shared, the signals output from the circuits can be detected outside of the pixel by shifting the output timings of the signals from the circuits from each other.

Figure 4:
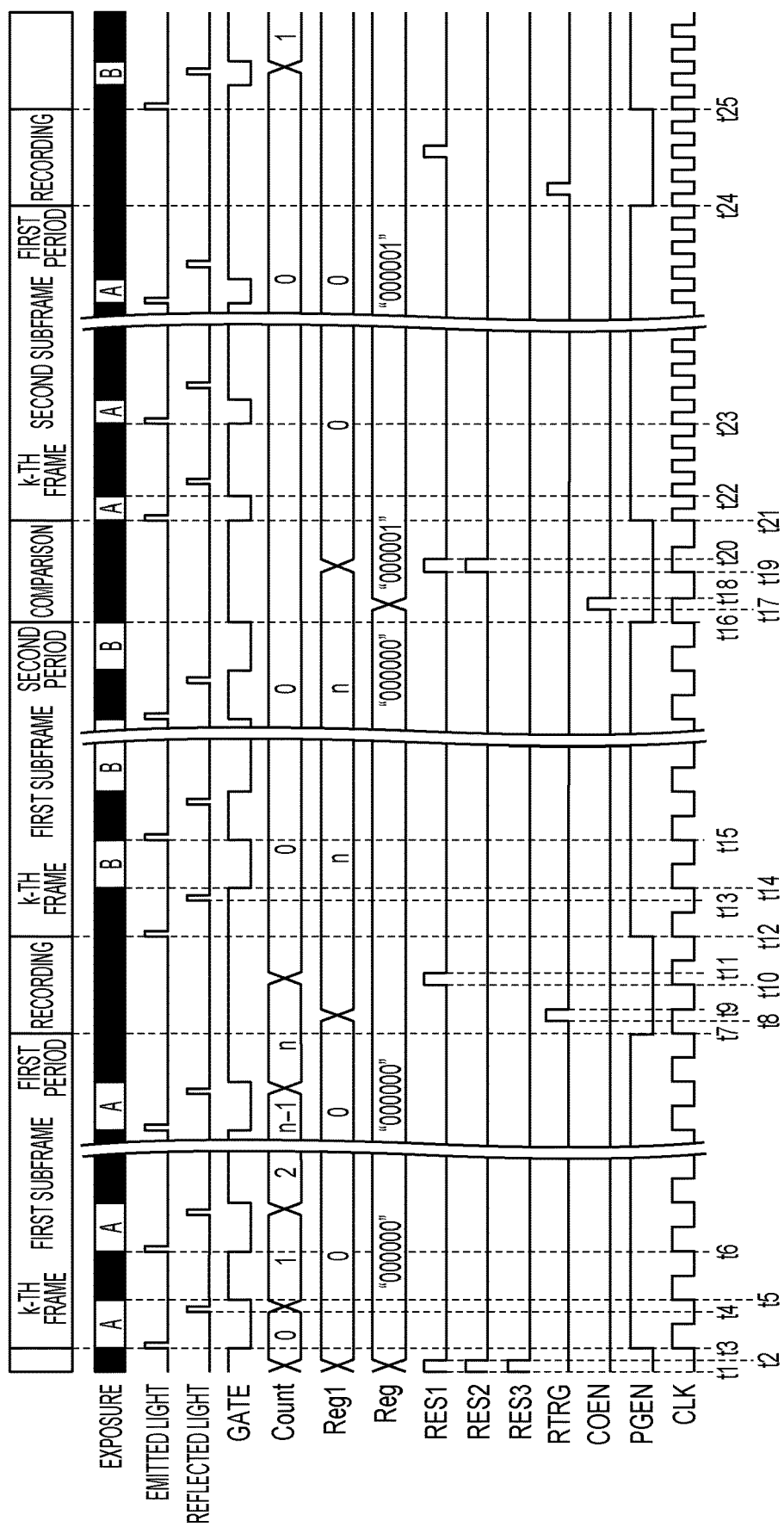
FIG. 4 is a timing diagram of pixel driving according to Embodiment 1.

FIG. 4 is a timing diagram illustrating the operations performed by the pixels of the photoelectric conversion device according to the present embodiment. During the period from time t1 to time t2, RES1, RES2, and RES3 are set to high level to initialize the held signals (Count, Reg1, Reg2) of the counter circuit 310, the register circuit 311, and the register circuit 313.

Driving performed in the first period for the first subframe of the k-th frame corresponding to the period from time t2 to time t7 is described first. At time t3, the light source emits pulsed light to an object to be measured. The pulsed light is reflected by the object to be measured and reaches a light receiving surface of the photoelectric conversion device at time t4. During the period from time t3 to time t5, the gate signal GATE input to the gate element is set to low level, so that the amount of light received by the APD 301 in a first exposure period A is measured.

That is, the first exposure period A is started by setting the gate signal GATE to low level at the same timing as the light emission timing of the light source. According to the present embodiment, since the gate element is composed of a PMOS transistor, the gate element is turned on at low level and is turned off at high level. During the period from time t5 to time t6, the gate signal GATE input to the gate element is set to high level to set the photoelectric conversion device in the non-exposure mode in which the light signal is not measured. That is, the first exposure period A is a period in which exposure is started after a first delay time has elapsed since the light emission timing of the light source. The first exposure period A is terminated by setting the gate signal GATE to high level after a predetermined period has elapsed. At t4 included in the exposure period A, a reflected light pulse is detected, so that a count value Count of the counter circuit 310 increases. By repeating the driving from time t2 to time t6 a plurality of times within the first period of the first subframe, the light signal in the exposure period A is accumulated.

Driving performed to record the signal held by the counter circuit 310 in the register circuit 311 during the period from time t7 to time t12 is described below. During the period from time t7 to time t12, the enable signal PGEN of the pulse generation circuit 314 is set to low level so that a light detection signal from the APD 301 is not counted by the counter circuit 310. During the period from time t7 to t12, the gate signal GATE input to the gate element is at high level. The trigger signal RTRG is set to high level during the period from time t8 to t9, and the output of the counter circuit 310 is recorded in the register circuit 311. As a result, the held signal value Reg1 in the register circuit 311 is changed. During the period from time t10 to time t11, the reset signal RES1 is set to high level to initialize the held signal in the counter circuit 310.

Driving performed during the second period of the first subframe of the k-th frame corresponding to the period from time t12 to t16 is described below. The timing of setting the gate signal GATE to high level is different from that in the first period of the first subframe described above. In the second period of the first subframe, the period from time t14 to time t15 is the exposure period B, and the period from time t12 to time t14 is the non-exposure period. That is, the exposure period B is a period in which exposure is started after a second delay time has elapsed since the light emission timing of the light source. The length of the second delay time is different than the length of the first delay time. The exposure period B is terminated by setting the gate signal GATE to high level after a predetermined period has elapsed since the start of the exposure period B. Unlike the driving performed in the first period of the first subframe described above, the reflected light reaches the light receiving surface at time t13. At this time, since the photoelectric conversion device is in the non-exposure period, the light signal is not counted.

Driving performed to compare the light signal amounts in the exposure periods A and B during the period from time t16 to t21 is described below. In a similar manner as described above, during the period from time t16 to t21, the enable signal PGEN of the pulse generation circuit 314 is set to low level so that the light detection signal from the APD 301 is not counted by the counter circuit 310. During the period from time t17 to t18, the enable signal COEN of the comparator circuit 312 is set to high level. Then, the result of comparison of the output of the register circuit 311 that holds the signal amount corresponding to the exposure period A and the output of the counter circuit 310 that holds the signal amount corresponding to the exposure period B is recorded in the register circuit 313 in the form of a digital signal. As a result, the held signal Reg2 of the register circuit 313 is changed.

During the period from time t19 to time t20, RES1 and RES2 are set to high level to initialize the held signals of the counter circuit 310 and the register circuit 311.

The first period of the second subframe of the k-th frame corresponding to the period from time t21 to time t24 has half the length of the exposure period A of the first subframe on the basis of the comparison result. Then, the pulse generation circuit 314 generates the gate signal GATE so as to set a new exposure period A defined by the period from time t21 to time t22. Herein, one of the two exposure periods obtained by dividing the exposure period A in which the signal accumulation amount in the first subframe is larger into two is set as the new exposure period A. The remaining exposure period of the exposure period A in the first subframe and the exposure period B of the first subframe are set as a non-exposure period. In a similar manner as described above, driving in the second period of the second subframe of the k-th frame continues after time t25. More specifically, of the two exposure periods obtained by dividing the exposure period A in which the signal accumulation amount in the first subframe is larger into equal halves, the remaining period of the newly set exposure period A is set as an exposure period B.

In this way, the sequence of the exposure operation (A), the recording operation, the exposure operation (B), and the comparison operation is repeated a predetermined number of times, and the binary search for the timing of the reflected light pulse is performed to determine the distance to the object to be measured. This increases the accuracy of measurement.

According to the present embodiment, driving has been described in which the frequency of the clock signal CLK input to the pulse generation circuit 314 is doubled at the time t21 when the first subframe is switched to the second subframe. However, driving is not limited thereto. A pulse generation circuit 314 may be used that can switch the exposure pattern interval for each of the subframes without changing the frequency. In addition, according to the present embodiment, periodic pulse light emission is used as the operation of the light source. However, the intensity and width of the emitted light and the temporal light emission pattern may be switched between different subframes.

In addition, in the above description, the signal value is output from the register circuit 313 after repeating the operation sequence a predetermined number of times. However, the present embodiment is not limited thereto. For example, a signal value may be output from the register circuit 313 to the signal line 113 every subframe or every several subframes. This makes it possible to obtain a rough distance measurement result before the end of one frame period.

According to the present embodiment, distance measurement can be performed at a higher speed than in the comparative embodiment.

Embodiment 2

Figure 5:
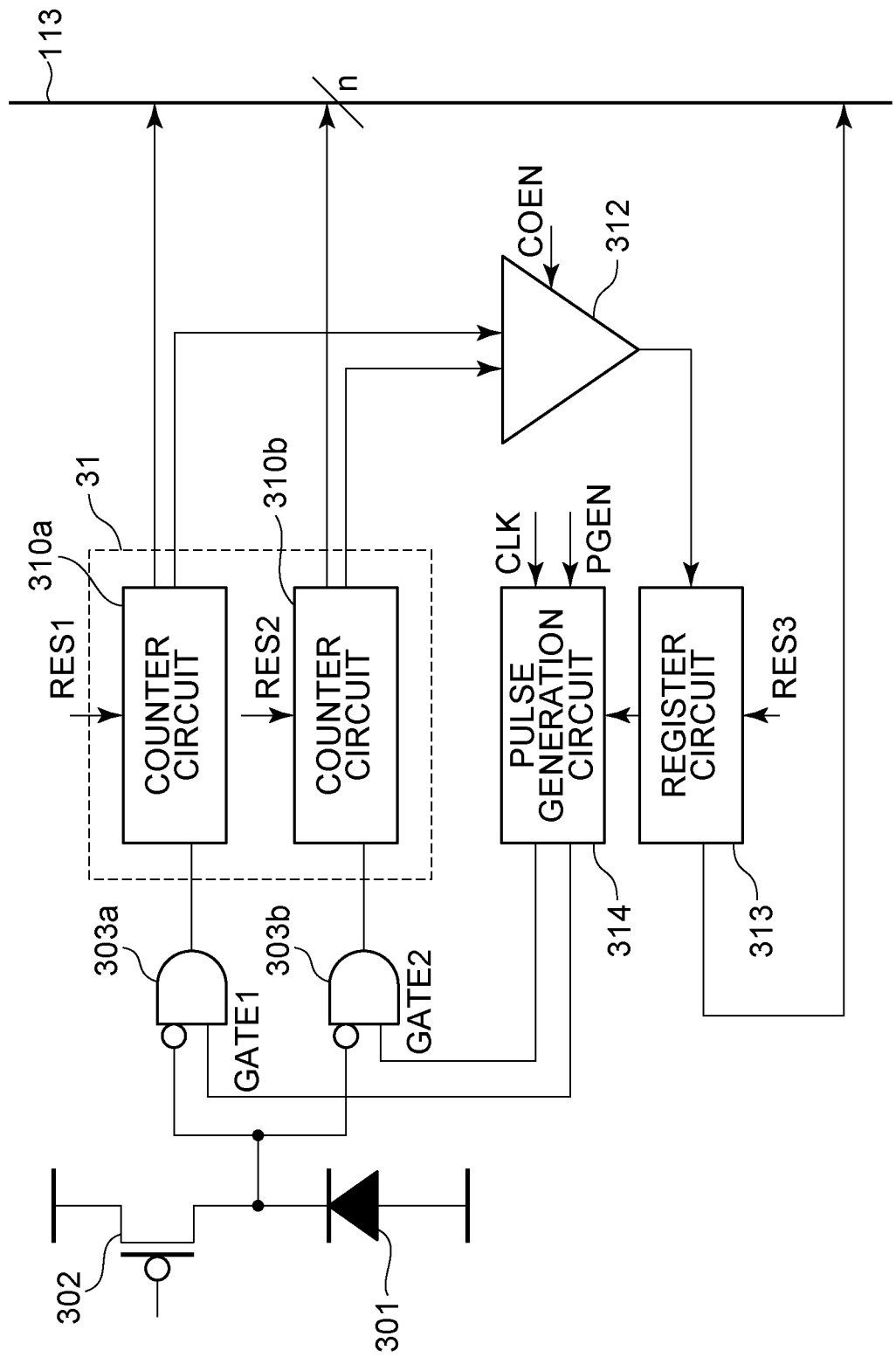
FIG. 5 is a block diagram of a unit pixel according to Embodiment 2.

Embodiment 2 is described with reference to FIGS. 5 and 6. FIG. 5 is an example of a block diagram of a unit pixel according to the present embodiment. The present embodiment differs from Embodiment 1 in the following ways. According to the present embodiment, the light value holding unit 31 is composed of two counter circuits 310a and 310b. An output terminal of the APD 301 is connected to two gate elements 303a and 303b disposed parallel, and the outputs of the two gate elements 303a and 303b are input to the counter circuits 310a and 310b, respectively. The comparator circuit 312 compares the outputs of counter circuits 310a and 310b. The pulse generation circuit 314 generates independent gate signals GATE1 and GATE2 for the gate elements 303a and 303b, respectively. Hereinafter, configurations different from those of Embodiment 1 are described, and description of configurations that are substantially the same as those of Embodiment 1 is not repeated.

The output from the gate element 303a is input to the counter circuit 310a. The output from the gate element 303b is input to the counter circuit 310b. The counter circuits 310a and 310b are connected such that the outputs thereof are input to the comparator circuit 312. Note that herein, the same reference symbols are used for elements having the same configuration but with an appended alphabetic character, such as a, b, or c, and the description of the elements may be omitted.

Figure 6:
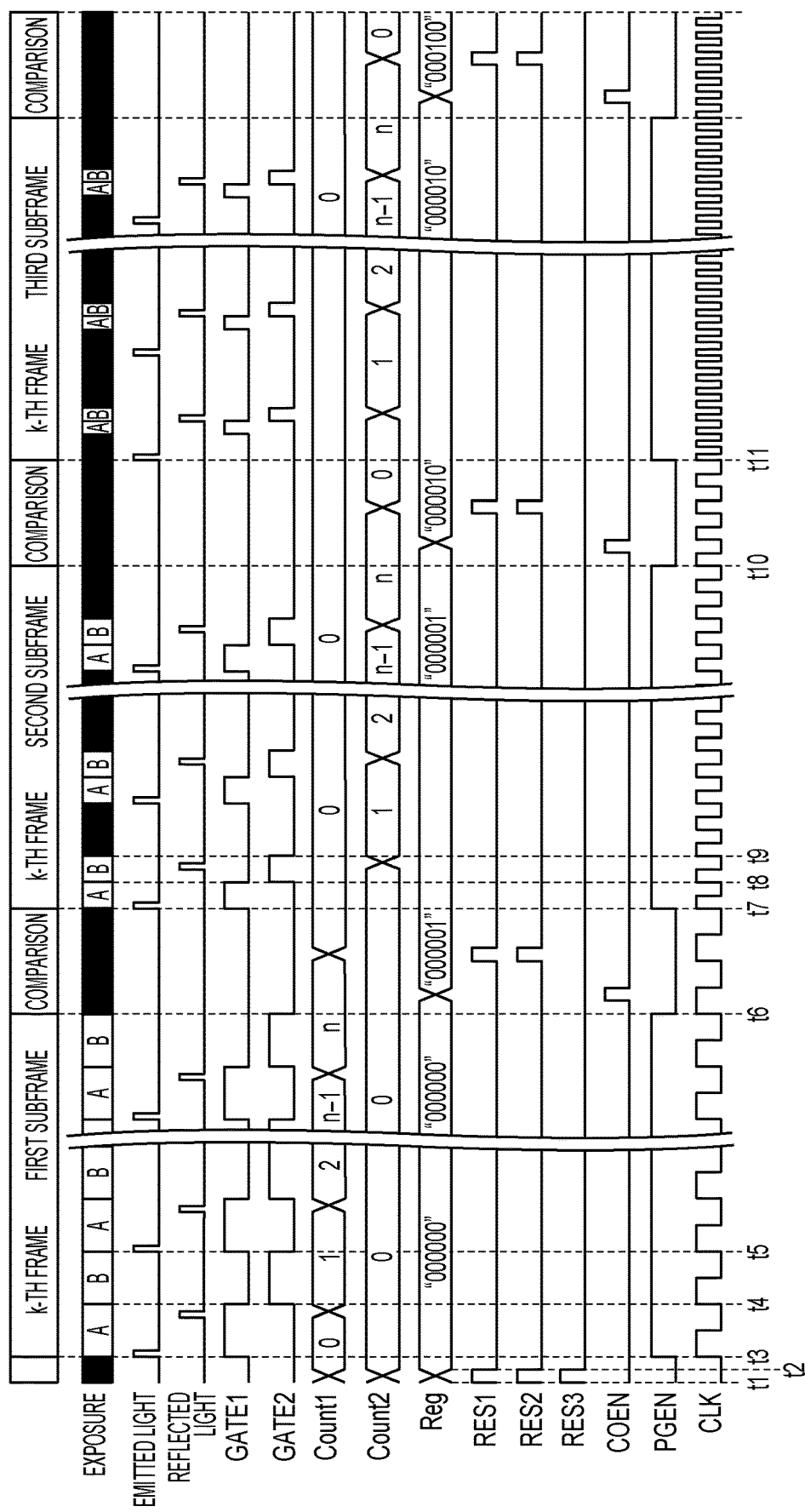
FIG. 6 is a timing diagram of pixel driving according to Embodiment 2.

FIG. 6 is a timing diagram illustrating the pixel drive operation performed by the photoelectric conversion device according to the present embodiment.

Reset signals RES1, RES2, and RES3 initialize the held signals in the counter circuits 310a and 310b and the register circuit 313, respectively. Unlike Embodiment 1 in which the sequence of the exposure operation (A), recording operation, exposure operation (B), and comparison operation is repeated, the present embodiment enables a sequence of the exposure operation (A, B) and comparison operation to be repeatedly performed. The exposure period A defined by setting the gate signal GATE1 to high level within the first subframe of the k-th frame corresponding to the period from time t3 to time t6 and the exposure period B defined by setting the gate signal GATE2 to high level are complementarily set. According to the present embodiment, each of the gate elements 303a and 303b is composed of an inverter circuit and a logic circuit. When avalanche multiplication occurs in APDs 301a and 301b, the cathode potential drops. Then, if the threshold is exceeded in the inverter circuit included in the gate element 303a, the potential is inverted. When the potential is input to the AND circuit, which is a logic circuit, a high level signal is output from each of the gate elements 303a and 303b. For example, the period from time t3 to time t4 is defined as an exposure period A. A light signal during this period is counted by the counter circuit 310a, the period from time t4 to time t5 is defined as an exposure period B, and a light signal during this period is counted by the counter circuit 310b.

Like Embodiment 1, the output signals of the counter circuits 310a and 310b are compared during the period from time t6 to time t7. Based on the comparison result, the exposure periods A and B are newly set in the second subframe of the k-th frame corresponding to the period from time t7 to time t10. At this time, the new exposure period A and the exposure period B are set as two exposure periods obtained by dividing the exposure period A in which the signal accumulation amount in the first subframe is larger into two halves. Then, similarly to the first subframe, the counter circuit 310a counts the amount of light during the newly set exposure period A, and the counter circuit 310b counts the amount of light during the exposure period B.

Like Embodiment 1, according to the present embodiment, distance measurement can be performed at a higher speed than in the comparative embodiment. In addition, since the intensities of the light signals in the exposure periods A and B can be obtained in parallel within a single subframe, the period from the exposure operation to the comparison operation can be decreased as compared with Embodiment 1. As a result, the measurement of distance to an object to be measured can be sped up. Furthermore, even when the object to be measured is moving, it is possible to reduce the lag time between the light signal measurements in the exposure periods A and B, which can improve the accuracy of distance measurement.

Modification of Embodiment 2

Figure 7:
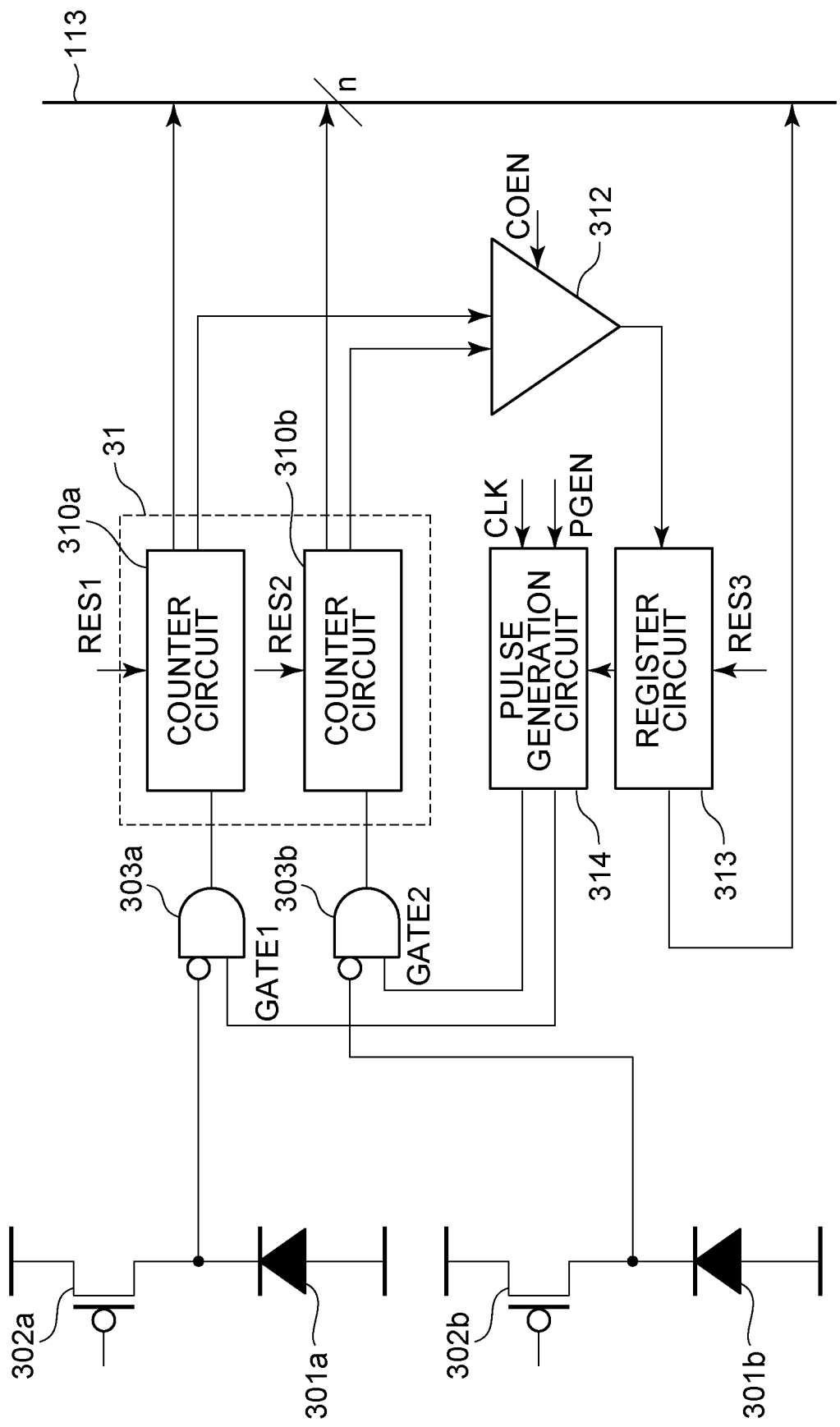
FIG. 7 is a block diagram of a unit pixel according to a modification of Embodiment 2.

A modification of Embodiment 2 is described with reference to FIG. 7. FIG. 7 is an example of a block diagram of a unit pixel according to the modification. Unlike Embodiment 2, according to the modification, two independent APDs 301a and 301b are connected to two gate elements 303a and 303b, respectively. Since the other configurations are substantially the same as those of Embodiment 2 except for the configurations described below, description of the configurations is not repeated. In addition, the driving method corresponding to the modification is based on the driving method according to Embodiment 2.

As illustrated in FIG. 7, the output from the APD 301a is input to the gate element 303a, and the output from APD 301b is input to the gate element 303b. Therefore, the counter circuit 310a counts the light amount detected by the APD 301a, and the counter circuit 310b counts the light amount detected by the APD 301b.

According to the present modification, like Embodiment 2, distance measurement can be performed at a higher speed than in the comparative embodiment. In addition, by using two spatially adjacent APDs, the intensities of the light signals during the exposure periods A and B can be obtained in parallel within a single subframe. As a result, the period from the exposure operation to the comparison operation can be reduced and, thus, the measurement of the distance to an object to be measured can be sped up. Furthermore, even when an object to be measured is moving, it is possible to minimize the lag time between the light signal measurements in the exposure periods A and B, which can improve the accuracy of distance measurement.

Embodiment 3

Figure 8:
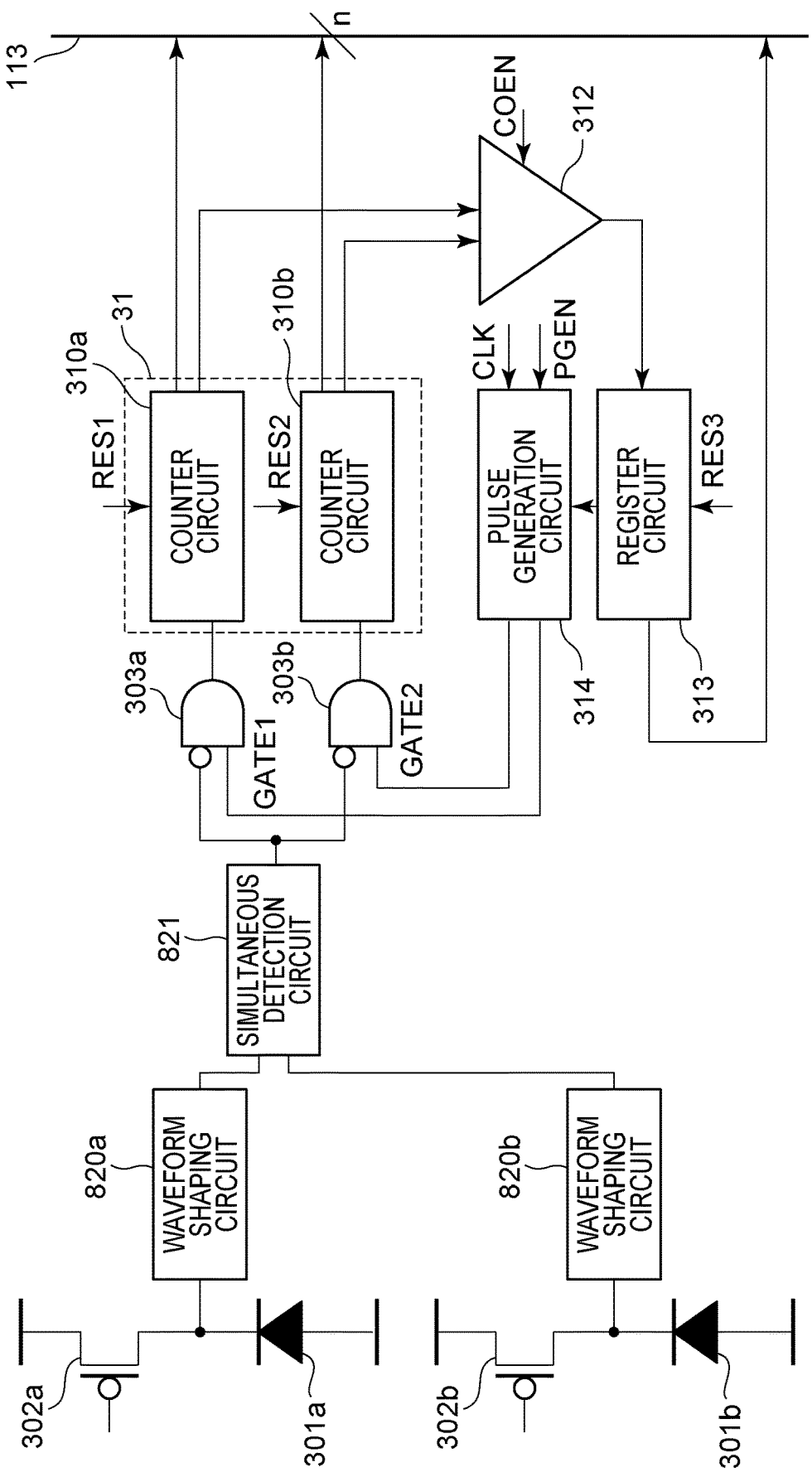
FIG. 8 is a block diagram of a unit pixel according to Embodiment 3.

Embodiment 3 is described with reference to FIG. 8. FIG. 8 is an example of a block diagram of a unit pixel according to the present embodiment. Unlike the modification of Embodiment 2, according to the present embodiment, the outputs from two independent APDs 301a and 301b and the outputs of two waveform shaping circuits 820a and 820b connected to the APDs 301a and 301b, respectively, are input to a simultaneous detection circuit 821, and the output of the simultaneous detection circuit 821 is connected to two gate elements 303a and 303b. The other configurations are substantially the same as those of the modification of Embodiment 2 except for the configuration description below, and description of the configurations is not repeated.

The waveform shaping circuits 820a and 820b have the function of shaping the waveforms of the outputs from respective APDs and are composed of, for example, an inverter circuit, a buffer circuit, or a monostable circuit that reduces the width of the pulse waveform. The simultaneous detection circuit 821 outputs a pulse signal when a predetermined number or more of the signals from the plurality of waveform shaping circuits are at high level at the same timing or at close timing. Note that three or more APDs and waveform shaping circuits may be connected to one simultaneous detection circuit 821. According to the present embodiment, a driving method similar to that of Embodiment 2 is employed.

According to the present embodiment, like Embodiment 1, distance measurement can be performed at a higher speed than in the comparative embodiment. In addition, it is possible to selectively detect only temporally and spatially close photons caused by reflected light and filter out ambient light components and dark signals that are randomly detected.

Therefore, it is possible to reduce the influence of ambient light and a dark signal on the accuracy of distance measurement based on the TOF technique.

Embodiment 4

Figure 9:
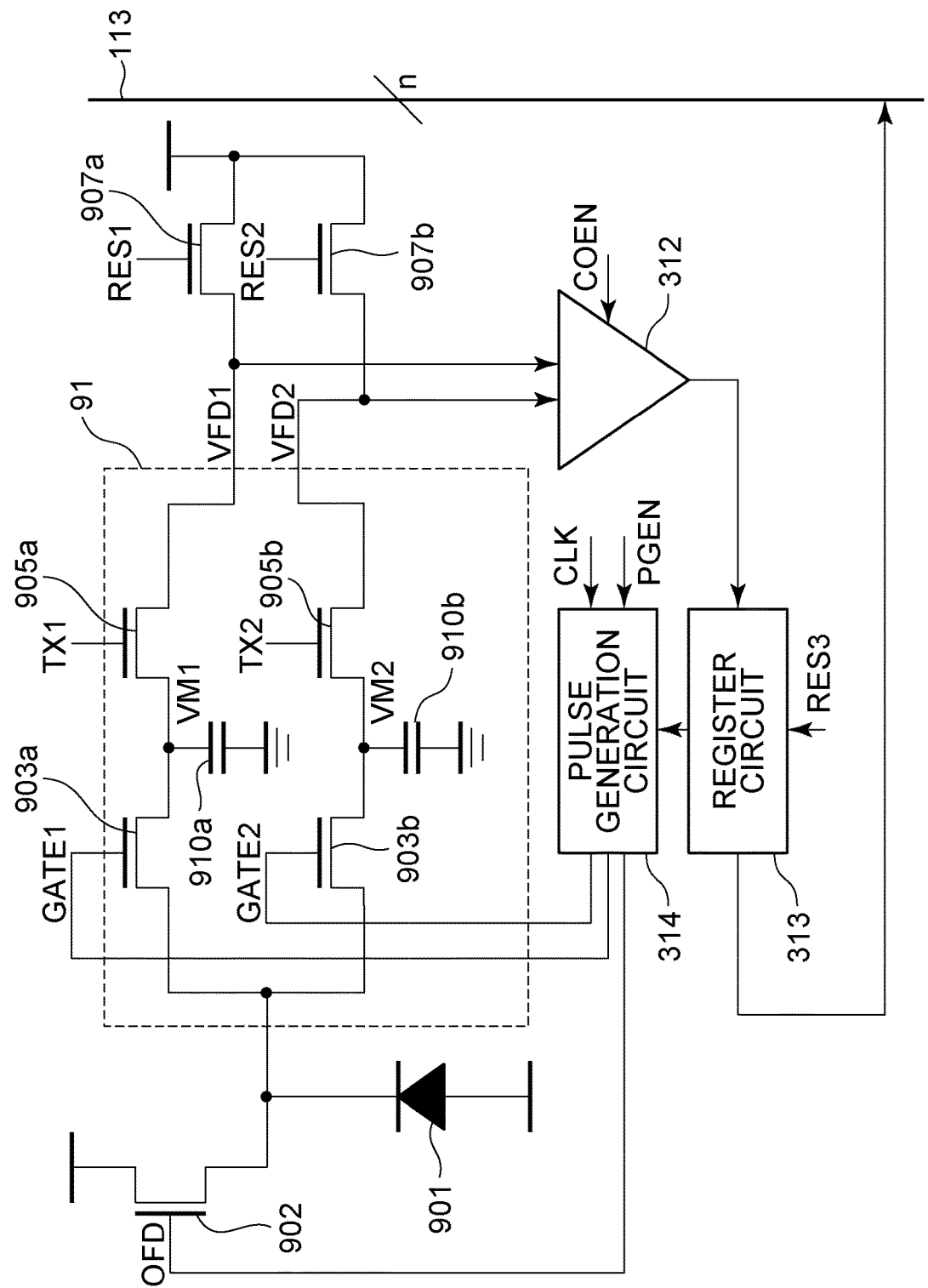
FIG. 9 is a block diagram of a unit pixel according to Embodiment 4.

Embodiment 4 is described with reference to FIGS. 9 and 10. FIG. 9 is an example of a block diagram of a unit pixel according to the present embodiment. Unlike Embodiment 1, the present embodiment uses a charge storage photodiode 901 instead of the APD 301, and analog signals are input to the comparator circuit 312. The other configurations are substantially the same as those of Embodiment 1 except for the configurations described below, and description of the configurations is not repeated.

Photocharge accumulated in the photodiode 901 is discharged or input to the light amount holding unit 91 at the time when the control signal OFD is input to an overflow drain circuit 902.

The light amount holding unit 91 includes transfer gates 903a and 903b, holding units 910a and 910b, and transfer gates 905a and 905b. When a gate signal GATE1 or GATE2 is received, photocharge photoelectrically converted by the photodiode 901 is transferred to a holding unit 910a or 910b via the transfer gate 903a or 903b. The signals held in the holding units are transferred to two floating diffusion (FD) regions FD1 and FD2 at the times when transfer gates 905a and 905b receive gate signals TX1 and TX2, respectively. Potentials VFD1 and VFD2 of the two FD regions are initialized at the time when the reset circuits 907a and 907b receive the reset signals RES1 and RES2, respectively.

Upon receiving the enable signal COEN, the comparator circuit 312 compares the magnitudes of the potentials VFD1 and VFD2 and records the comparison result in the register circuit 313. The pulse generation circuit 314 receives the held signal of the register circuit 313, the clock signal CLK, and the enable signal PGEN and generates the gate signals GATE1 and GATE2 that define an exposure pattern and the control signal OFD. The reset signal RES3 initializes the held signal of the register circuit 313.

Figure 10:
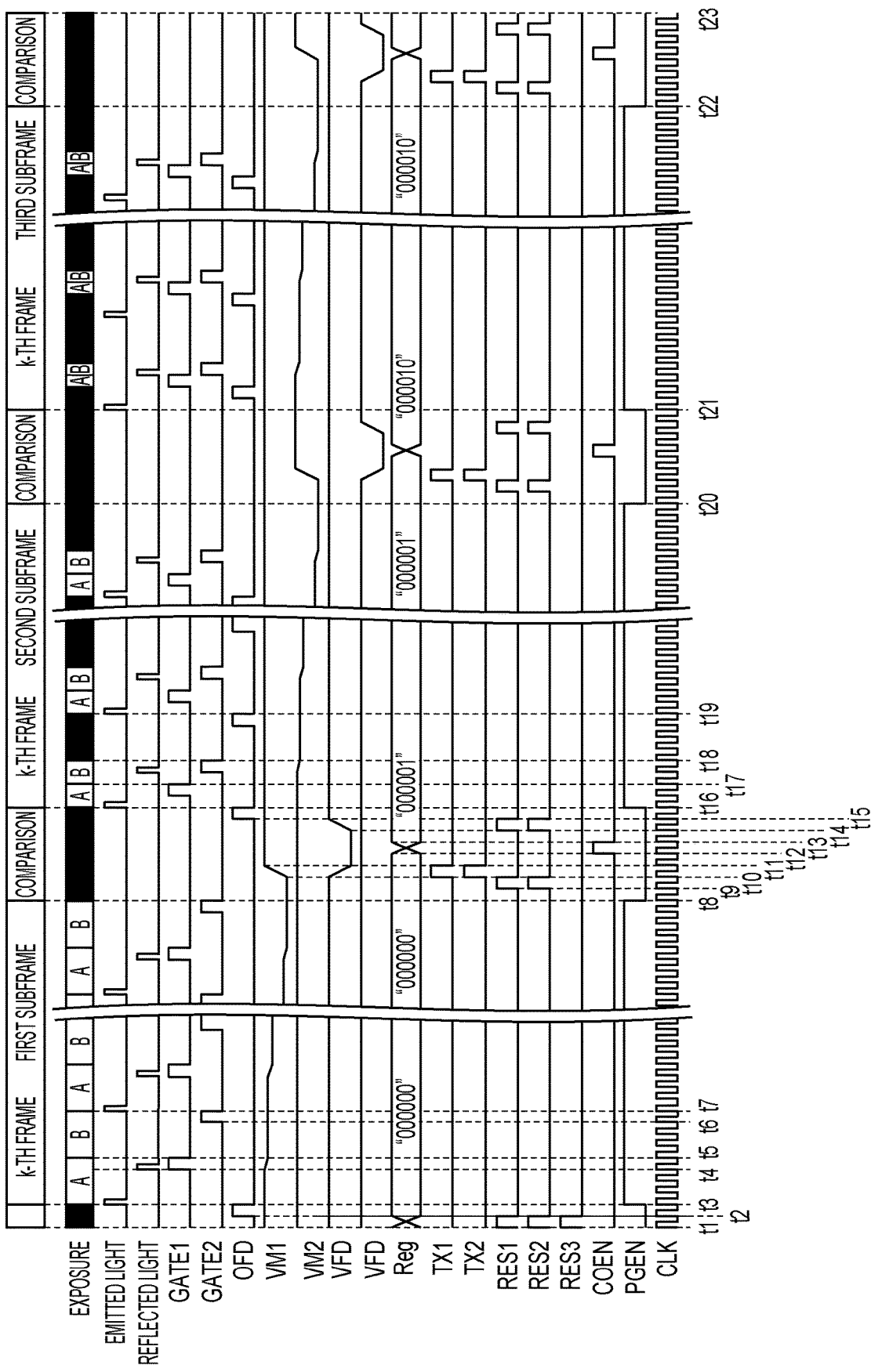
FIG. 10 is a timing diagram of pixel driving according to Embodiment 4.

FIG. 10 is a timing diagram of the operation performed by the pixels of the photoelectric conversion device according to the present embodiment. During the period from time t1 to time t2, RES1, RES2, and RES3 are set to high level to initialize the potentials VFD1 and VFD2 of the two FD regions and the held signal of the register circuit 313. During the period from time t2 to time t3, the control signal OFD is set to high level to reset the charge accumulated in the photodiode 901.

Driving performed in the first subframe of the k-th frame corresponding to the period from time t3 to time t8 is described first. At time t3, the light source emits pulsed light to an object to be measured. The pulsed light is reflected by the object to be measured and reaches the light receiving surface at time t4. By setting the gate signal GATE1 to high level during the period from time t4 to time t5, the photocharge received by the photodiode 901 during the first exposure period A corresponding to time t3 to t5 is transferred. In addition, by setting the gate signal GATE2 to high level during the period from time t6 to time t7, photocharge received by the photodiode 901 during the second exposure period B corresponding to time t5 to time t7 is transferred. At this time, since a pulse of the reflected light is detected at t4 included in the exposure period A, a voltage value VM1 of the holding unit 910a changes. By repeating driving from time t3 to time t7 a plurality of times within the period of the first subframe, light signals in the exposure periods A and B are accumulated.

Driving for comparing the held signals of the holding units 910a and 910b during the period from time t8 to time t16 is described below. During the period from time t8 to time t16, the enable signal PGEN of the pulse generation circuit 314 is set to low level so that the light detection signal from the photodiode 901 is not transferred to the holding units 910a and 910b. During the period from time t9 to time t10, RES1 and RES2 are set to high level to reset the FD potentials VFD1 and VFD2. During the period from time t10 to time t11, the transfer signals TX1 and TX2 are set to high level, and the signal charges held in the holding units 910a and 910b are transferred to FD1 and FD2, respectively. During the period from time t12 to time t13, the enable signal COEN of the comparator circuit 312 is set to high level. Then, the comparison result of the magnitudes of VFD1 corresponding to the accumulated signal amount during the exposure period A and VFD2 corresponding to the accumulated signal amount during the exposure period B is recorded in the register circuit 313 in the form of a digital signal. During the period from time t14 to time t15, RES1 and RES2 are set to high level to reset the FD potentials VFD1 and VFD2 again. During the period from time t15 to time t16, the control signal OFD is set to high level to reset the charge accumulated in the photodiode 901.

In the second subframe of the k-th frame corresponding to the period from time t16 to time t20, a new exposure period A, a new exposure period B, and a non-exposure period are set on the basis of the comparison result, and the pulse generation circuit 314 generates gate signals GATE1 and GATE2 and a control signal OFD.

The new exposure period A has half the length of the exposure period A of the first subframe and is defined by the period from time t16 to time t17. The new exposure period B is defined by the period from time t17 to time t18. The non-exposure period is defined by the period from time t18 to time t19. Herein, two exposure periods obtained by dividing the exposure period A, in which the signal accumulation amount in the first subframe is larger, into two halves are set as the new exposure periods A and B. In the same manner as described above, the driving of the third subframe of the k-th frame continues after time t21 through the comparison operation from time t20 to time t21.

In this way, the sequence of the exposure operation (A, B) and the comparison operation is repeated a plurality of times, and the binary search for the timing of the reflected light pulse is performed, so that the accuracy of measurement of the distance to the object to be measured is improved.

While the present embodiment has been described with reference to an example of a "charge holding method" using the capacitance for holding a photocharge signal as means for holding a light signal, a "voltage holding method" may be employed in which the charge information is converted into voltage information via, for example, a transistor amplifier and the voltage signal is held.

According to the present embodiment, like Embodiment 1, distance measurement can be performed at a higher speed than in the comparative embodiment. In addition, by using a charge storage photodiode instead of an APD, the operating voltage can be reduced. In addition, by using a capacitive element that holds charge or voltage instead of a counter circuit or a register circuit, miniaturization of the pixel can be made.

Embodiment 5

The present embodiment is described with reference to FIGS. 11A and 11B. FIGS. 11A and 11B are explanatory diagrams of an example of the exposure pattern selection procedure according to the present embodiment. FIG. 11A illustrates the case where the reflected light reaches the photoelectric conversion device in the first half of the period corresponding to the light emission cycle, and FIG. 11B illustrates the case where the reflected light reaches the sensor in the second half of the period corresponding to the light emission cycle.

Unlike Embodiment 1, according to the present embodiment, the exposure periods A and B of the first subframe do not cover the period corresponding to the light emission cycle. In the first subframe illustrated in FIG. 11A, the amounts of light signals in the exposure periods A and B are compared. At this time, if neither of the signals in the two exposure periods reaches a certain threshold, it is determined that "no signal is included in either exposure period A or B" in signal comparison. Then, the exposure periods A and B in the second subframe are set so as not to overlap with the exposure periods A and B in the first subframe and so as to have the same lengths as the exposure periods A and B in the first subframe. In the second subframe, the timing of the reflected light is included in the exposure period B, and a signal amount exceeding the threshold is obtained. Therefore, in the signal comparison, it is determined that "the signal is included in the exposure period B", and the exposure periods A and B of the third subframe are determined by further dividing the exposure period B of the second subframe into two halves.

In contrast, in FIG. 11B, since the timing of the reflected light is included in the exposure period A of the first subframe, it is determined that "the signal is included in the exposure period A" in the signal comparison. Then, the exposure periods A and B of the second subframe are determined by further dividing the exposure period A of the first subframe into two halves.

By using the binary search method according to the present embodiment, it is possible to speed up the distance measurement by preferentially searching the period around the timing of the reflected light estimated in advance.

Embodiment 6

Figure 12B:
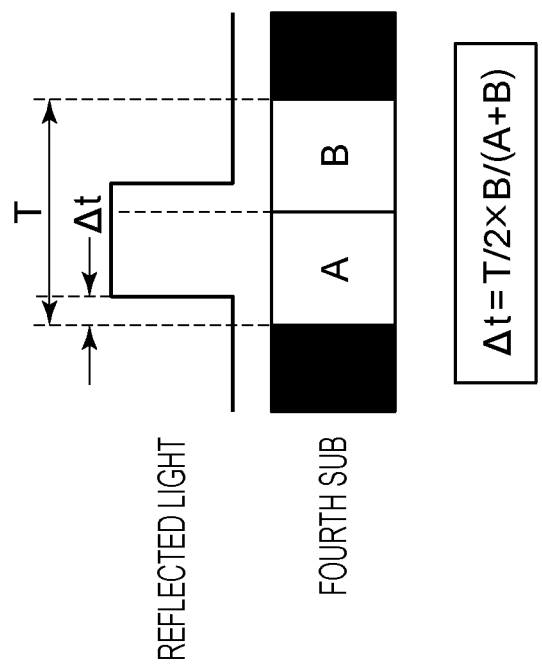
FIGS. 12A and 12B are timing diagrams illustrating an exposure pattern according to Embodiment 6.
Figure 12A:
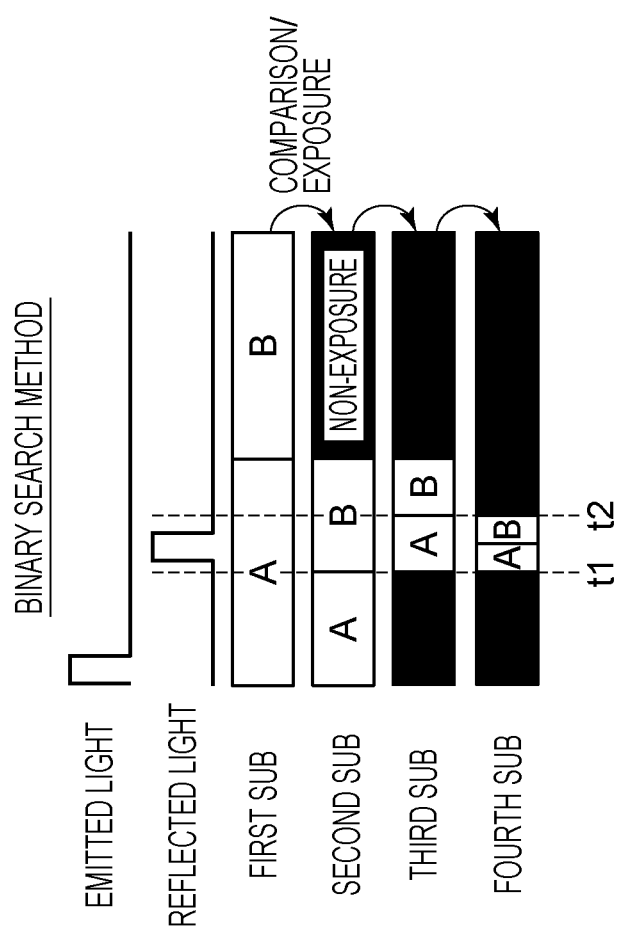

The present embodiment is described with reference to FIGS. 12A and 12B. FIGS. 12A and 12B are explanatory diagrams of an example of distance measurement using binary search according to the present embodiment. Unlike Embodiment 1, in FIG. 12A, the pulse width of the emitted light is set to be substantially the same as the exposure periods A and B of the fourth subframe, which is the final subframe.

FIG. 12B is an enlarged view of the reflected light and the exposure pattern of the fourth subframe around the period from time t1 to t2 in FIG. 12A. The case is discussed below where the reflected light arrives at a timing delayed by $\Delta t$ with respect to the start time t1 of the exposure pattern A. Since most of the reflected light is included in the exposure period A, the signal amount in the exposure period A is larger than in the exposure period B. At this time, assuming that the pulse width of the reflected light and the width of the exposure periods A and B are the same, $\Delta t$ can be given by the following equation using the internal division ratio for the signal amounts A and B:

$$\Delta t = T/2 \times B/(A+B) \qquad \text{Equation 1.}$$

In the above-described equation 1, it is assumed that the influence of ambient light and dark signal are negligible. However, the ambient light and dark signal may be measured separately and are subtracted from the signals A and B and, thereafter, $\Delta t$ may be calculated using the above equation.

According to the present embodiment, it is possible to achieve a finer time resolution than the length of the exposure period of the final subframe, which can improve the accuracy of distance measurement.

Embodiment 7

Figure 13:
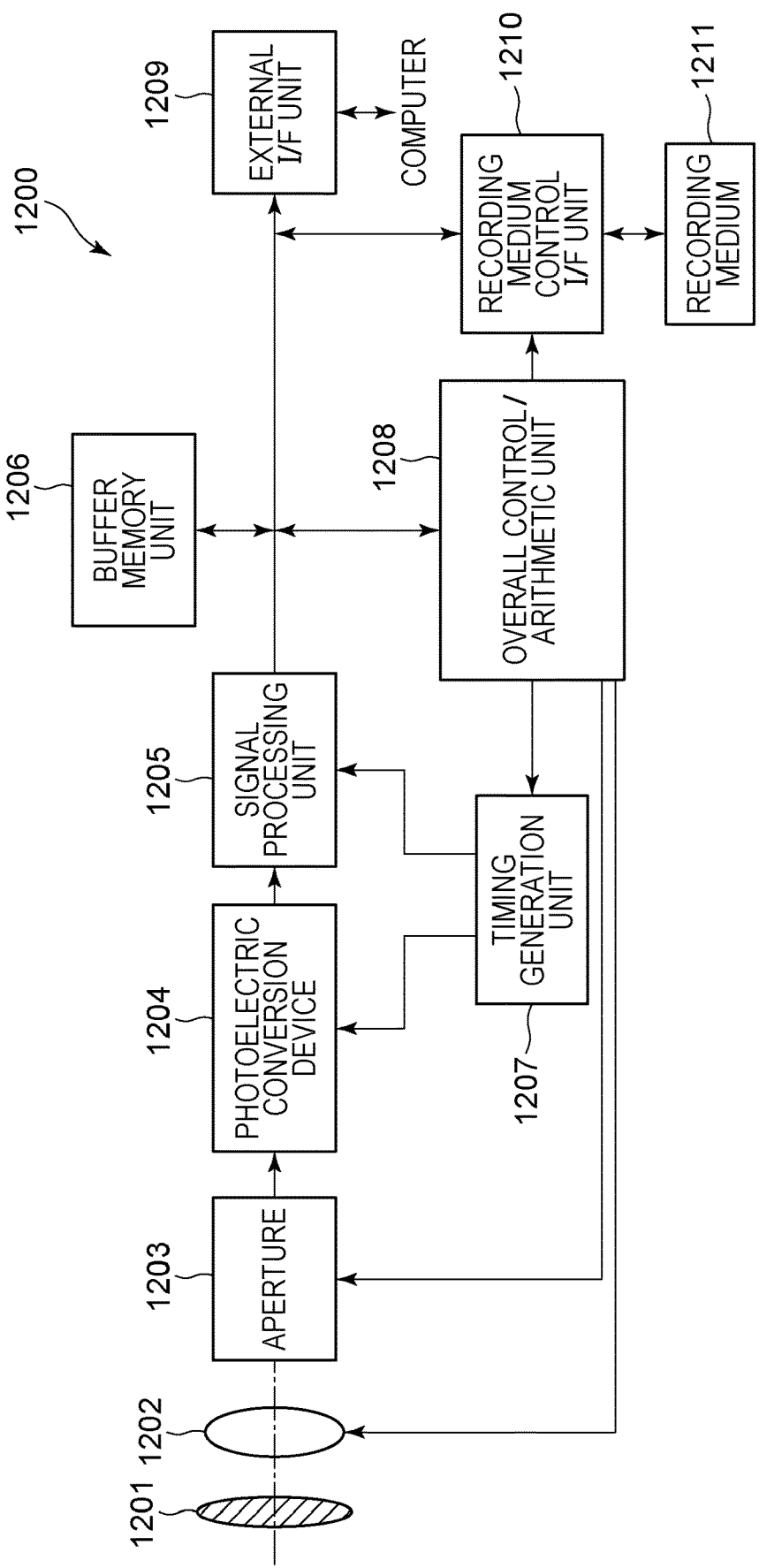
FIG. 13 is a block diagram of a photoelectric conversion system according to Embodiment 7.

FIG. 13 is a block diagram of the configuration of a photoelectric conversion system 1200 according to the present embodiment. The photoelectric conversion system 1200 according to the present embodiment includes a photoelectric conversion device 1204. At this time, any one of the photoelectric conversion devices described in the above embodiments can be used as the photoelectric conversion device 1204. The photoelectric conversion system 1200 can be used, for example, as an imaging system. Specific examples of an imaging system include a digital still camera, a digital camcorders, a surveillance camera, and the like. FIG. 13 illustrates an example of the photoelectric conversion system 1200 which is a digital still camera.

The photoelectric conversion system 1200 illustrated in FIG. 13 includes the photoelectric conversion device 1204, a lens 1202 for forming an optical image of an object on the photoelectric conversion device 1204, an aperture 1203 for varying the amount of light passing through the lens 1202, and a barrier 1201 for protecting the lens 1202.

The lens 1202 and the aperture 1203 are an optical system for focusing light onto the photoelectric conversion device 1204.

The photoelectric conversion system 1200 includes a signal processing unit 1205 that processes an output signal output from the photoelectric conversion device 1204. The signal processing unit 1205 performs a signal processing operation to perform a variety of corrections and compressions on an input signal as necessary and output the signal. The photoelectric conversion system 1200 further includes a buffer memory unit 1206 for temporarily storing image data and an external interface unit (external I/F unit) 1209 for communicating with an external computer or the like.

The photoelectric conversion system 1200 further includes a recording medium 1211, such as a semiconductor memory, for recording or reading captured image data, and a recording medium control interface unit (recording medium control I/F unit) 1210 for recording or reading data onto and from the recording medium 1211. The recording medium 1211 may be built in the photoelectric conversion system 1200 or may be removable.

Communication of the recording medium control I/F unit 1210 with the recording medium 1211 and communication of the external I/F unit 1209 with the recording medium control I/F unit 1210 may be performed wirelessly.

The photoelectric conversion system 1200 further includes an overall control/arithmetic unit 1208 that performs various calculations and performs overall control of the digital still camera and a timing generation unit 1207 that outputs a variety of timing signals to the photoelectric conversion device 1204 and the signal processing unit 1205. The timing signals or the like may be input from the outside, and the photoelectric conversion system 1200 is only required to include at least a photoelectric conversion device 1204 and the signal processing unit 1205 that processes the output signal output from the photoelectric conversion device 1204. The timing generation unit 1207 may be mounted in the photoelectric conversion device, as described in the fourth embodiment. The overall control/arithmetic unit 1208 and the timing generation unit 1207 may be configured to perform some or all of the control functions of the photoelectric conversion device 1204.

The photoelectric conversion device 1204 outputs an image signal to the signal processing unit 1205. The signal processing unit 1205 performs predetermined signal processing on the image signal output from the photoelectric conversion device 1204 and outputs image data. In addition, the signal processing unit 1205 generates an image using the image signal. The signal processing unit 1205 may perform distance measurement calculation on the signal output from the photoelectric conversion device 1204. Note that the signal processing unit 1205 and the timing generation unit 1207 may be mounted in the photoelectric conversion device. That is, the signal processing unit 1205 and the timing generation unit 1207 may be provided on a substrate having the pixels arranged thereon or may be provided on another substrate. By configuring an imaging system using the photoelectric conversion device according to any one of the above-described embodiments, it is possible to achieve an imaging system capable of acquiring a higher quality image.

Embodiment 8

Figure 14:
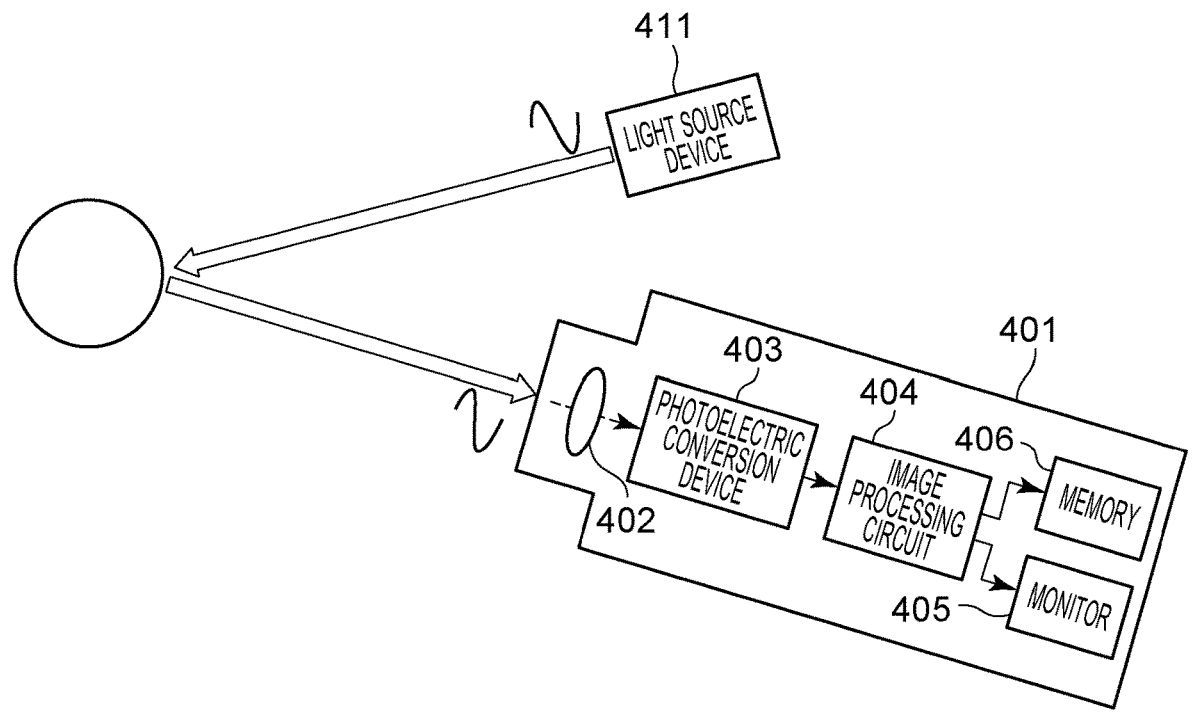
FIG. 14 is a block diagram of a photoelectric conversion system according to Embodiment 8.

FIG. 14 is a block diagram of an example of the configuration of a range image sensor (a TOF system), which is electronic equipment using the photoelectric conversion device described in the above-described embodiment.

As illustrated in FIG. 14, a range image sensor 401 includes an optical system 402, a photoelectric conversion device 403, an image processing circuit 404, a monitor 405, and a memory 406. The range image sensor 401 receives light (modulated light or pulsed light) emitted from a light source device 411 to an object and reflected by the surface of the object and, thus, can obtain a range image in accordance with the distance to the object.

The optical system 402 includes one or more lenses. The optical system 402 guides image light (incident light) from an object to the photoelectric conversion device 403 and forms an image on the light receiving surface (a sensor unit) of the photoelectric conversion device 403.

As the photoelectric conversion device 403, the photoelectric conversion device of any one of the embodiments described above is applied, and a distance signal indicating the distance obtained from the received light signal output from the photoelectric conversion device 403 is supplied to the image processing circuit 404.

The image processing circuit 404 performs image processing to construct a range image based on the distance signal supplied from the photoelectric conversion device 403. The range image (image data) obtained through the image processing is supplied to the monitor 405 and is displayed. In addition, the range image is supplied to the memory 406 and is stored (recorded).

In the range image sensor 401 configured in this way, by applying the above-described photoelectric conversion device, it is possible to obtain, for example, a more accurate range image in accordance with improvement of the characteristics of the pixels.

Embodiment 9

A photoelectric conversion system according to the present embodiment and a moving object are described with reference to FIG. 15. FIG. 15 is a schematic illustration of an example of the configuration of the photoelectric conversion system according to the present embodiment and a moving object. According to the present embodiment, an example of an on-vehicle camera is described as the photoelectric conversion system.

FIG. 15 illustrates an example of a vehicle system and a photoelectric conversion system mounted therein for imaging. According to the present embodiment, two photoelectric conversion devices 1302 are disposed in the front section of a vehicle 1300. More specifically, to obtain distance information between the vehicle 1300 and the object to be image-captured and determine the possibility of a collision, it is desirable to regard the forward/backward travel direction or the center line of the outer shape of the vehicle 1300 (for example, the width of the vehicle) as the axis of symmetry and place the two photoelectric conversion devices 1302 in line symmetry with respect to the axis of symmetry. In addition, it is desirable that the photoelectric conversion devices 1302 be disposed so as not to obstruct the driver's field of vision when the driver sitting at the driver's seat visually identifies the situation outside the vehicle 1300. Note that an additional photoelectric conversion device 1302 may be disposed in the rear section of the vehicle 1300 to sound an alarm when a vehicle behind approaches.

In this way, the photoelectric conversion device can be applied to autonomous driving control for, for example, following another vehicle and keeping the lane. Furthermore, the photoelectric conversion system 1301 can be applied not only to a vehicle, such as one's own vehicle, but also to a moving object (a moving apparatus), such as a ship, an aircraft, or an industrial robot. Still furthermore, the photoelectric conversion device can be applied not only to a moving object but also to equipment that uses object recognition over a wide area, such as intelligent transportation systems (ITS).

The photoelectric conversion device according to the present invention may further have a configuration capable of acquiring a variety of types of information, such as distance information.

OTHER EMBODIMENTS

While the embodiments have been described above, the present invention is not limited to the embodiments, and various changes and modifications can be made. Moreover, the embodiments are mutually applicable.

According to the present invention, it is possible to measure the distance from the photoelectric conversion device to the object to be measured at a higher speed than in PTL 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photoelectric conversion device comprising:
   a photoelectric conversion unit which is an avalanche photodiode;
   a light value holding unit configured to hold light values based on signal charges generated during a first exposure period and a second exposure period having at least one of start timing and end timing different from that of the first exposure period;
   a comparison unit configured to compare the light value based on the signal charge generated during the first exposure period with the light value based on the signal charge generated during the second exposure period; and
   a control unit configured to set a third exposure period and a fourth exposure period having at least one of the start timing and end timing different from that of the third exposure period on a basis of a comparison result of the comparison unit,
   wherein the light value holding unit includes a digital counter circuit configured to count a signal amplified through avalanche multiplication in the photoelectric conversion unit, and wherein the third exposure period and the fourth exposure period are less than at least one of the first exposure period and the second exposure period.

2. The photoelectric conversion device according to claim 1, wherein the light value holding unit includes a recording circuit that hold a count value of the digital counter circuit.

3. The photoelectric conversion device according to claim 1, wherein the digital counter circuit includes a first counter circuit and a second counter circuit,
wherein the light value during the first exposure period is counted by the first counter circuit, and
wherein the light value during the second exposure period is counted by the second counter circuit.

4. The photoelectric conversion device according to claim 1, wherein the photoelectric conversion unit includes a first avalanche photodiode and a second avalanche photodiode,
wherein the digital counter circuit includes a first counter circuit and a second counter circuit,
wherein the light value obtained from the first avalanche photodiode during the first exposure period is counted by the first counter circuit, and
wherein the light value obtained from the second avalanche photodiode during the second exposure period is counted by the second counter circuit.

5. The photoelectric conversion device according to claim 1, wherein the avalanche photodiode is an SPAD that operates in Geiger mode.

6. The photoelectric conversion device according to claim 1, wherein the third exposure period and the fourth exposure period are less than the first exposure period and the second exposure period.

7. The photoelectric conversion device according to claim 1, wherein if in the comparison result of the comparison unit, the light value during the first exposure period and the light value during the second exposure period do not reach a predetermined threshold, a period that overlaps neither the first exposure period nor the second exposure period is set as the third exposure period and the fourth exposure period.

8. The photoelectric conversion device according to claim 1, wherein the third exposure period and the fourth exposure period are set within a length of the first exposure period or the second exposure period, whichever has a greater light amount in the comparison result of the comparison unit.

9. The photoelectric conversion device according to claim 8, wherein the first exposure period or the second exposure period, whichever has a smaller light amount in the comparison result of the comparison unit, is set to the non-exposure period.

10. The photoelectric conversion device according to claim 1, wherein a length of the first exposure period is the same as a length of the second exposure period, and
wherein the length of the third exposure period is the same as a length of the fourth exposure period.

11. The photoelectric conversion device according to claim 1, wherein a switch configured to control whether nodes of the photoelectric conversion unit and the light value holding unit are connected to each other is provided between nodes of the photoelectric conversion unit and the light value holding unit, and
wherein the first exposure period, the second exposure period, the third exposure period, and the fourth exposure period are set by controlling on and off of the switch.

12. The photoelectric conversion device according to claim 11, wherein the first exposure period is started by changing a control signal for the switch from a first level to a second level at the same timing as light emission timing of a light source or timing when a predetermined period elapses after the light emission timing and is ended by changing the control signal for the switch from the second level to the first level at timing when a predetermined period elapses after the start of the first exposure period, and
wherein the second exposure period is started by changing the control signal for the switch from the first level to the second level at timing when a predetermined period elapses after the end of the first exposure period and is ended by changing the control signal for the switch from the second level to the first level at timing when a predetermined period elapses after the start of the second exposure period.

13. The photoelectric conversion device according to claim 11, wherein the switch is composed of a PMOS transistor.

14. The photoelectric conversion device according to claim 1, wherein the second exposure period is repeated a plurality of number of times after the first exposure period is repeated,
wherein the light value obtained during the first exposure period is a value obtained by accumulating the light values obtained during the plurality of first exposure periods, and
wherein the light value obtained during the second exposure period is a value obtained by accumulating the light values obtained during the plurality of second exposure periods.

15. The photoelectric conversion device according to claim 14, further comprising:
a signal processing unit,
wherein the light value obtained during the first exposure period and the light value obtained during the second exposure period are output to the signal processing unit.

16. The photoelectric conversion device according to claim 15, wherein the light value during each of the plurality of first exposure periods before accumulation is further output to the signal processing unit, and
wherein the light value during each of the plurality of second exposure periods before accumulation is further output to the signal processing unit.

17. The photoelectric conversion device according to claim 1, wherein the photoelectric conversion unit is disposed on a first substrate, and the comparison unit is disposed on a second substrate, and
wherein the first substrate and the second substrate are stacked and joined.

18. The photoelectric conversion device according to claim 1, wherein the photoelectric conversion device is a photoelectric conversion device configured to measure light emitted from a light source and reflected by a physical object,
wherein the first exposure period is a period to start exposure with a first lag time after light emission timing of the light source,
wherein the second exposure period is a period to start exposure with a second lag time after the light emission timing of the light source, and
wherein a length of the first lag time is different from a length of the second lag time.

19. A photoelectric conversion system comprising:
a light source; and
the photoelectric conversion device according to claim 1,
wherein light emitted from the light source and reflected by a physical object is measured by the photoelectric conversion device.

20. A photoelectric conversion device comprising:
- a photoelectric conversion unit which is an avalanche photodiode;
- a light value holding unit including a digital counter circuit configured to count a signal amplified through avalanche multiplication in the photoelectric conversion unit, and configured to hold light values based on signal charges obtained when light is incident during a first exposure period and a second exposure period having at least one of start timing and end timing different from that of the first exposure period;
- a comparison unit configured to compare the light value obtained during the first exposure period with the light value obtained during the second exposure period; and
- a control unit configured to control a third exposure period and a fourth exposure period in accordance with a comparison result of the comparison unit.

* * * * *